United States Patent
Eida et al.

(10) Patent No.: US 6,344,712 B1
(45) Date of Patent: *Feb. 5, 2002

(54) ORGANIC ELECTROLUMINESCENT DISPLAY DEVICE CAPABLE OF PREVENTING COLOR MIXING

(75) Inventors: Mitsuru Eida; Chisio Hosokawa; Masahide Matsuura, all of Sodegaura (JP)

(73) Assignee: Idemitsu Kosan Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/147,104
(22) PCT Filed: Feb. 4, 1998
(86) PCT No.: PCT/JP98/00467
§ 371 Date: Oct. 5, 1998
§ 102(e) Date: Oct. 5, 1998
(87) PCT Pub. No.: WO98/34437
PCT Pub. Date: Aug. 6, 1998

(30) Foreign Application Priority Data

Feb. 4, 1997 (JP) .............................. 9-034240

(51) Int. Cl.[7] .............................. H01J 1/62; H01J 63/04
(52) U.S. Cl. .................. 313/504; 313/501; 313/461; 313/473
(58) Field of Search .................. 313/498, 501, 313/502, 504, 506, 509, 311; 428/690, 917; 315/169.3

(56) References Cited

U.S. PATENT DOCUMENTS

| 4,143,297 A | * | 3/1979 | Fischer ...................... 313/509 |
| 4,983,469 A | * | 1/1991 | Huzino et al. .............. 313/506 |
| 5,239,228 A | * | 8/1993 | Taniguchi et al. .......... 313/509 |
| 5,294,870 A | * | 3/1994 | Tang et al. ................. 313/504 |
| 5,346,776 A | * | 9/1994 | Taniguchi et al. .......... 313/506 |
| 5,529,853 A | * | 6/1996 | Hamada et al. ............. 313/504 |
| 5,589,732 A | * | 12/1996 | Okibayashi et al. ........ 313/506 |
| 5,780,174 A | * | 7/1998 | Tokito et al. ............... 313/506 |
| 5,847,506 A | * | 12/1998 | Nakayama et al. ......... 313/504 |
| 5,869,929 A | * | 2/1999 | Eida et al. .................. 313/501 |
| 5,949,188 A | * | 9/1999 | Leising et al. .............. 313/505 |
| 5,952,137 A | * | 9/1999 | Ihara et al. ................. 313/470 |
| 6,008,578 A | * | 12/1999 | Chen .......................... 313/506 |

FOREIGN PATENT DOCUMENTS

| JP | 63-148597 | 6/1988 |
| JP | 08-279394 | 10/1996 |

* cited by examiner

Primary Examiner—Nimeshkumar D. Patel
Assistant Examiner—Mariceli Santiago
(74) Attorney, Agent, or Firm—Oblon, Spivak, McClelland, Maier & Neustadt, P.C.

(57) ABSTRACT

An organic electroluminescence display device 100 comprises a color modulating member 2 including a plurality of shading layers 21 and a plurality of color modulating layers 22, the layers 21 and 22 being arranged in a planar and discrete manner, an organic EL electroluminescent member 3 including a plurality of organic EL elements arranged in a planar and discrete manner at a site corresponding to the color modulating layers 22, and a transparent medium 1 sandwiched between the color modulating member 2 and the organic EL electroluminescent member 3, wherein the relation $d2 \geq d1$ is satisfied, with d1 being a distance between the color modulating member 2 and the organic EL electroluminescent member 3, and d2 being a width of the shading layer. A practical organic EL display device is thus provided which has an excellent viewing angle property as well as an excellent visuality and which can prevent occurrence of color-shift (color mixing) and blot.

21 Claims, 16 Drawing Sheets

(a)

(b)

(c)

(a)

(b)

(a)

(b)

(c)

(a)

(b)

ORGANIC ELECTROLUMINESCENT DISPLAY DEVICE CAPABLE OF PREVENTING COLOR MIXING

TECHNICAL FIELD

The present invention relates to an organic electroluminescence display device (hereinafter, abbreviated simply as "organic EL display device"). More particularly, the invention relates to an organic EL display device that is suitably used, as a display, a light source for the printer-head, or the like, for the civil and industry uses.

BACKGROUND ART

As generally called a "man-machine interface", an electric display device is an electronic device for visually transmitting various information from various machines to a man and has an important role as an interface to connect a man with a machine.

As the electric device, an active type (light-emitting type) and a passive type (light-accepting type) are known. The active type includes CRT (Cathode Ray Tube), PDP (Plasma Display Panel), ELD (Electroluminescence Display/EL Display Device), VFD (Vacuum Fluorescent Display), LED (Light-emitting Diode), or the like. On the other hand, the passive type includes LCD (Liquid Crystal Display), ECD (Electrochemical Display), EPID (Electro Phoretic Image Display), SPD (Suspended Particle Display), TBD (Twisting Ball Display), PLZT (Transparent Ceramic display using the strong dielectric PLZT [$(Pb, La)(Zr, Ti)O_3$]), or the like.

The EL display device (ELD) or an EL element, which constructs the ELD, has a high visuality because of the self-emission, and the high durability against the shock because they are completely solid. Therefore, the development of various EL display devices is in progress now, in which inorganic and organic compounds are used in emitting layers. Among them, an organic EL display device, wherein an organic compound is sandwiched between two electrodes, is strongly expected as a display that can very efficiently and very brightly emit light of various kinds of colors because of the variety of organic compound.

Therefore, methods for constructing a full-color organic display device have been keenly developed. For example, Japanese Patent Laid-open Publication No. Hei8-264828 discloses a method to emit each of different colors (e.g. three primary colors of red, blue, and green) by plane and discretely placing the emitting parts of the organic EL display device.

There were problems, however, that it is necessary to newly develop emitting materials for each color to plane and discretely place emitting parts of the organic EL display element, and to display by emitting light of different colors, and that it has a low durability to a process (e.g. photolithography), in which it is plane and discretely placed, because the material per se is an organic compound.

Therefore, a method to decompose or modulate monochrome light through a color modulating layer (e.g. a color filter or a fluorescent layer) has been proposed (Japanese Patent Laid-open Publication No. Hei3-152897). This method is excellent in the point that it can be simply constructed because providing only a single color as an emitting layer is enough.

There are, however, some gaps between an organic EL element and a color modulating layer or between color modulating layers because it is necessary to provide a color modulating layer in addition to the organic EL element. Therefore, from these gaps light from the organic EL element or light from the light-modulating layer leak, and the viewing angle became narrow (i.e. color shift), giving an organic EL display device with a low visuality.

Thus, Japanese Patent Laid-open Publication No. Hei5-94878 discloses an EL display device in which a transparent resin layer is provided between an EL element and a color filter, with the thickness of the transparent resin layer being thinner than the distance between pixels of the EL element (See FIG. 15).

The problem of viewing angle has not been adequately solved, however, because there is no shading layer in such constitution, and leak of light from the side surface of the color filter layer can not be controlled. In addition, in case a fluorescent layer is used instead of the color filter layer, the fluorescent pigment(dye) more isotropically fluoresces, and as a result, leak of light becomes large, and a visuality became inferior.

In Japanese Patent Laid-open Publication No. Hei5-258860, is disclosed a multi-color luminescence way that luminescence of an organic EL element can be received (See FIG. 16).

The problem of viewing angle has not been adequately solved, however, because no shading layer between fluorescent media is shown in such constitution.

In Japanese Patent Laid-open Publication No. Hei5-94879, is disclosed an EL panel in which a spacer, which has a shading property and nearly perpendicularly projects against the substrate surface of the EL element, is provided, and a color filter is placed oppositely (See FIG. 17).

Although there is no problem concerning viewing angle in this case, the relation between the thickness of the shading layer and that of the color modulating layer and the relation between the distance from the organic EL element to the shading layer and the width of the shading layer are not taken into account, therefore such a problem occurred that an organic EL display device could not be constructed practically.

In Japanese Patent Laid-open Publication No. Sho63-40888, is disclosed a color display in which an EL element and a color filter are placed oppositely (See FIG. 18). In such constitution, however, the relation between the thickness of the shading layer and that of the color modulating layer, and the relation between the distance from the organic EL element to the shading layer and the width of the shading layer, are not taken into account, therefore such a problem occurred that a full-color EL display device could not be constructed practically.

The present invention was conceived in view of the above problems. It is therefore the object of the present invention to provide a practical organic EL display device that is excellent in a viewing angle property and a visuality, and allows a prevention of occurrence of color shift (color-mixing).

DISCLOSURE OF THE INVENTION

In the organic EL display device according to the present invention, a color modulating member composed of shading layers and color modulating layers, and an organic EL luminescent member composed of organic EL elements, are placed sandwiching a transparent medium to achieve the above-mentioned purpose, satisfying the relation $d2 \geq d1$, with d1 being the distance between the color modulating member and the organic EL luminescent member; d2 being the width of the shading layer.

In case the organic EL display device is constructed according to the present invention, it is preferred to construct the color modulating member with different kinds of color modulating layers.

In case the organic EL display device is constructed according to the present invention, it is preferred to construct the color modulating member with one kind of a color modulating layer.

In case the organic EL display device is constructed according to the present invention, it is preferred to satisfy the relation $T1 \geq T2$, with the thickness of the shading layer being T1; that of the color modulating layer being T2.

In case the organic EL display device is constructed according to the present invention, it is preferred to satisfy the relation $|T1-T2| \leq 2.0 \mu m$, with T1 being the thickness of the shading layer; T2 being that of the color modulating layer.

In case the organic EL display device is constructed according to the present invention, it is preferred to satisfy the relation $S2 \geq S1$, with S1 being the area of the luminescent region of the organic EL element; S2 being that of the color modulating layer.

In case the organic EL display device is constructed according to the present invention, it is preferred to construct the color modulating layer from a fluorescent layer.

In case the organic EL display device is constructed according to the present invention, it is preferred that the coat thickness of the color modulating layer is equal to or thicker than 5 $\mu m$.

In case the organic EL display device is constructed according to the present invention, it is preferred to satisfy the relation $|n1-n2|<0.4$, with n1 being the refractive index of the color modulating layer; n2 being that of the transparent medium.

In case the organic EL display device is constructed according to the present invention, it is preferred to gradually or stepwise reduce the width of the shading layer from the transparent medium side to the opposite side.

In case the organic EL display device is constructed according to the present invention, it is preferred that the transmittance of light in the visible region of 400 nm to 700 nm of the shading layer is 10% or less.

In case the organic EL display device is constructed according to the present invention, it is preferred that the reflectance of light in the visible region of 400 nm to 700 nm of the shading layer is 10% or more.

BEST MODE FOR CARRYING OUT THE INVENTION

The best mode for carrying out the invention will now be described specifically with reference to the accompanying drawings.

1. Constitution of Organic EL Display Device

Figure 1:
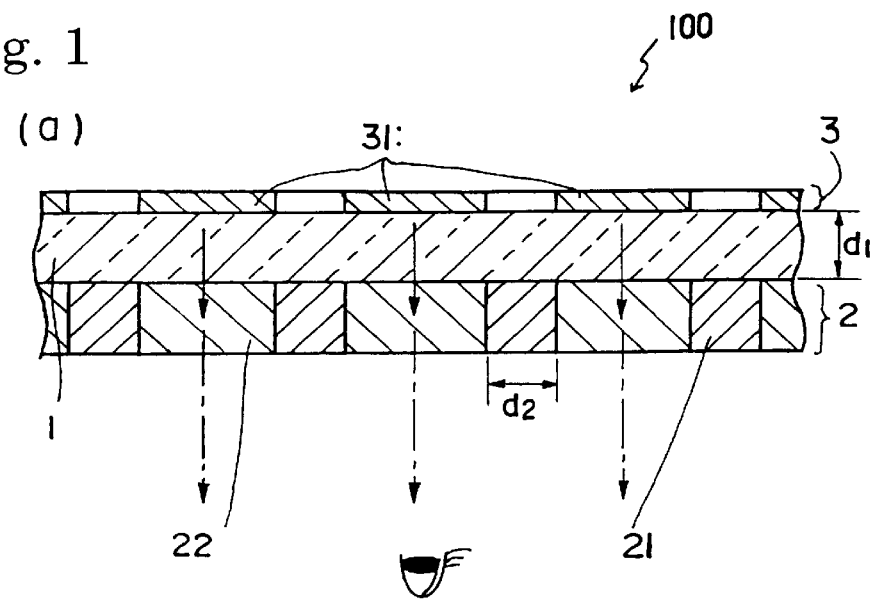
FIG. 1 illustrates an embodiment of an organic EL display device of the present invention, in which (a) is a sectional view, and (b) and (c) are perspective views respectively.
Figure 1:
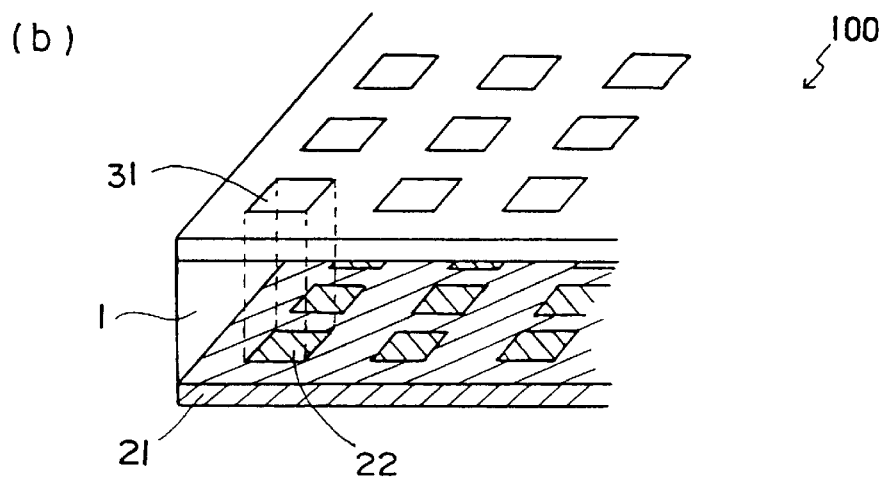
Figure 1:
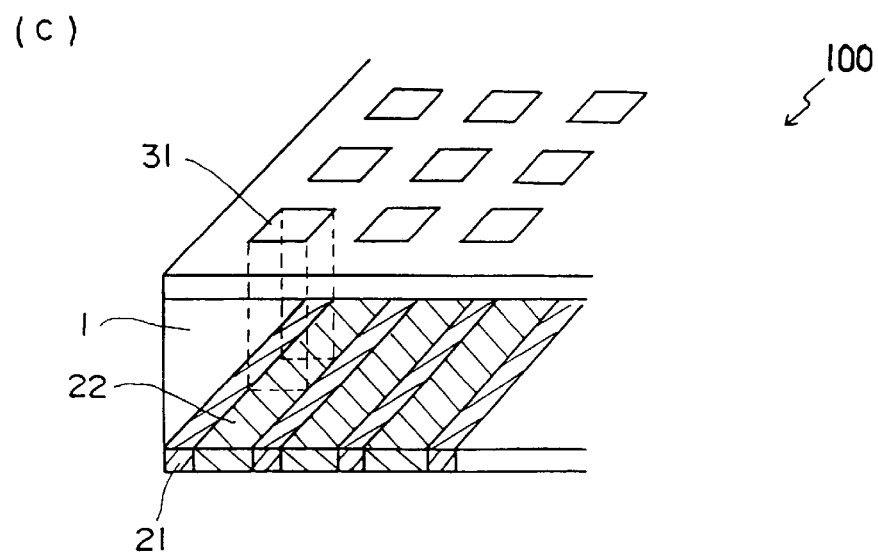

As FIGS. 1a–1c show, the organic EL display device 100 is constructed with a color modulating member 2 and an organic EL luminescent member 3 sandwiching at least a transparent medium 1. In the color modulating member 2, a plurality of shading layers 21 and a plurality of color modulating layers 22 are placed plane, repeatedly, and discretely. In an organic EL luminescent member 3, a plurality of organic EL elements are plane and discretely placed in the position corresponding to the color modulating layer 22.

Accordingly, if each organic EL element 31 luminescens, the light transmits the transparent medium 1, the light emitted from the organic EL element 31 is decomposed or modulated through the corresponding color modulating layer 22, and visualized as luminescence whose color is different from the light from the organic EL element 31.

Therefore, in case each the color modulating member 2 is constructed with a different kind of color modulating layers 22 in this way, multi-color display becomes possible in the organic EL display device 100. Multi-color display can also be carried out by transmitting the luminescence of the organic EL element 31 without modulation by forming a part (transparent layer) in which a color modulating layer is not provided in a part of the color modulating member 2.

In case the color modulating member 2 is constructed with the same kind of color modulating layers, monochrome display becomes possible in the organic EL display device 100.

Next, the constitution including more concrete supporting substrate in the organic EL display device 100 according to the present invention will be described below. Practically, the organic EL display device 100 requires a substrate to support itself.

Figure 2:
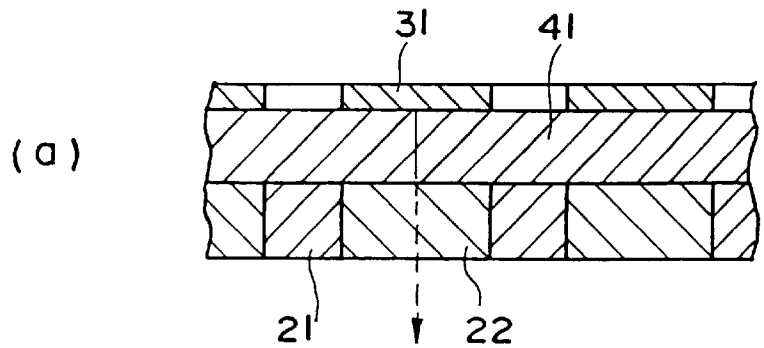
FIG. 2 is a sectional view for explaining a supporting substrate used in the present invention, in which (a) and (b) show the case where a transparent supporting substrate is used; and (c) shows the case where it is not necessary to use a transparent one.
Figure 2:
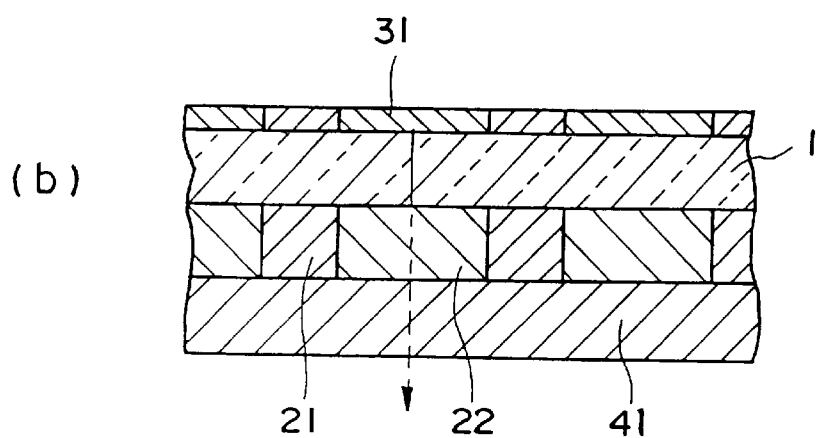
Figure 2:
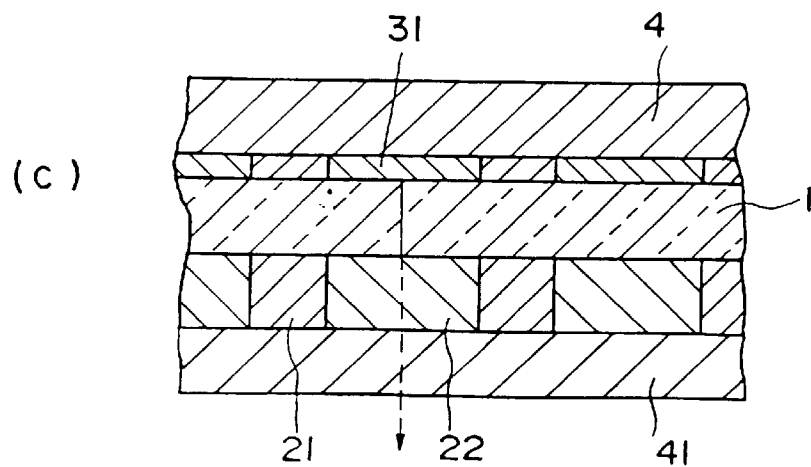

Examples for it are shown in FIGS. 2a–2c. FIG. 2a illustrates the case that the transparent medium 1 has another role as a supporting substrate and constitutes a transparent supporting substrate 41.

In FIG. 2b, a transparent supporting substrate 41 is placed below the color modulating layers 22 and the shading layers 21.

In FIG. 2c, two supporting substrates are used; the first supporting substrate 41 is placed below the color modulating layers 22 and the shading layers 21; the second supporting substrate 4 is placed on an organic EL luminescent member 3 including the organic EL element 31.

Figure 3:
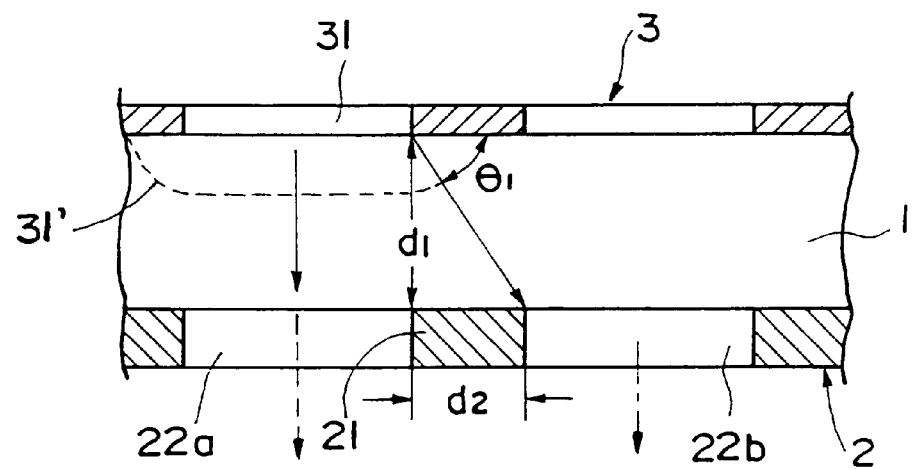
FIG. 3 is a sectional view for explaining the relation between d1 and d2, wherein d1 is the distance between the organic EL luminescent member and the color-modulating member; d2 the width of the shading layer, in which (a) shows the case of d1>d2 and (b) shows the case of $d1 \leq d2$.
Figure 3:
Figure 3:
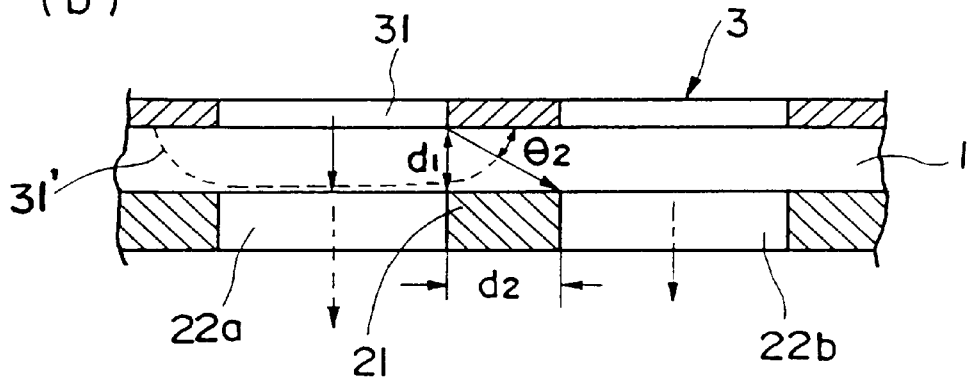
Figure 3:

Next, the reasons why the relation between the distance (d1) from a color modulating member 2 to an organic EL luminescent member 3 and the width (d2) of a shading layer 21 must be restricted in case multi-color or monochrome display is carried out in the organic EL display device 100, i.e., the reasons why the relation $d2 \geq d1$ must be satisfied in the organic EL display device 100 will be described below referring to FIGS. 3a and 3b, wherein the distance (d1) from a color modulating member 2 to an organic EL luminescent member 3 is defined as the shortest distance between a shading layer 21 or a color modulating layer 22 of said color modulating member 2 and a position corresponding to the boundary to the transparent medium 1, and in case the position corresponding to said boundary is defined, a shading layer 21 and/or a color modulating layer 22 are selected so that the distance to an organic EL element is shortest, more strictly it is expressed as a length (distance) of the perpendicular that is drawn from the position corresponding to the boundary between a shading layer 21 or a color modulating layer 22 and the transparent medium 1 to the position mainly corresponding to a luminescent part such as a luminescent layer in an organic EL element. In FIGS. 3a and 3b also, d1 is expressed as a distance of the perpendicular in this way; d2 is expressed as a width of a shading layer 21 on the side that contacts with the transparent medium 1; d2 is illustrated in this way also in FIGS. 3a and 3b.

As the light emitted from an organic EL element 31 is isotropically radiated, if the light is not absorbed in the transparent medium 1, the intensity of the light is equally distributed depending on the distance from said organic EL element 31. Therefore, as shown in FIG. 3a, a significant amount of light is radiated not only to a color modulating layer 22a at the position corresponding to the organic EL element 31 but also to the adjacent color modulating layer 22b.

Therefore, as shown in FIG. 3a, in the case of d1>d2, the angle ($\theta_1$) of incidence of the light entered into the color modulating layer 22b becomes large, and the intensity of the light entered into the color modulating layer 22b becomes high. As a result, the light having a color from an unintended color modulating layer 22b is significantly mixed ("color-mixing") as well as the light having a desired color obtained by decomposing or modulating in a color modulating layer 22a, and the light corresponding to a desired color might not be adequately visualized. "Color-mixing" in the present invention is the case that the X- and Y-shifts are larger than 0.02 against CIE chromaticity coordinates of luminescent light from the intrinsic color modulating layer.

Although in case the color modulating layers are of the same kind, i.e., above-mentioned color modulating layer 22a and color modulating layer 22b are the same kind, the color-mixing problem does not occur even if d1>d2, the display becomes unclear and fuzzy, and lacks clearness.

In contrast to it, as shown in FIG. 3b, in case the relation $d2 \geq d1$ is satisfied, the angle ($\theta_2$) of incidence of the light entered into the color modulating layer 22b becomes small, and the intensity of the light entered into the color modulating layer 22b becomes low. As a result, color-mixing is reduced, and the light corresponding to desired light can be visualized.

Thus, in case multi-color or monochrome display is carried out in the organic EL display device 100 according to the present invention, a practical organic EL display device with reduced color shift (color-mixing) can be provided by reducing the light entered into the adjacent color modulating layer 22b through a shading layer on both sides of the color modulating layer 22a by satisfying the relation $d2 \geq d1$.

In addition, in case the color modulating layers are of the same kind, reduction of clear display such as unclear and fuzzy display can be prevented by satisfying such a relation.

Concerning the relation between d1 and d2, preferred (d2−d1) value is 1–100 $\mu$m. In case the (d2−d1) value is smaller than 1 $\mu$m, unevenness of thickness of the transparent medium 1 could generate a region that does not satisfy the relation $d2 \geq d1$ partially. On the other hand, in case the (d2−d1) value is larger than 100 $\mu$m, the width of the shading layer 21 becomes large, and could cause reduction of high fineness and clearness of image.

Accordingly, the more preferred (d2−d1) value is within the range of 5–50 $\mu$m, and the most preferred (d2−d1) value is within the range of 10–40 $\mu$m.

In addition, it is preferred to satisfy the relation $T1 \geq T2$ in the organic EL display device according to the present invention, with T1 being a thickness of a shading layer; T2 being a thickness of a color modulating layer. The reason for this will be described below referring to FIGS. 4, 5a–5f.

Figure 4:
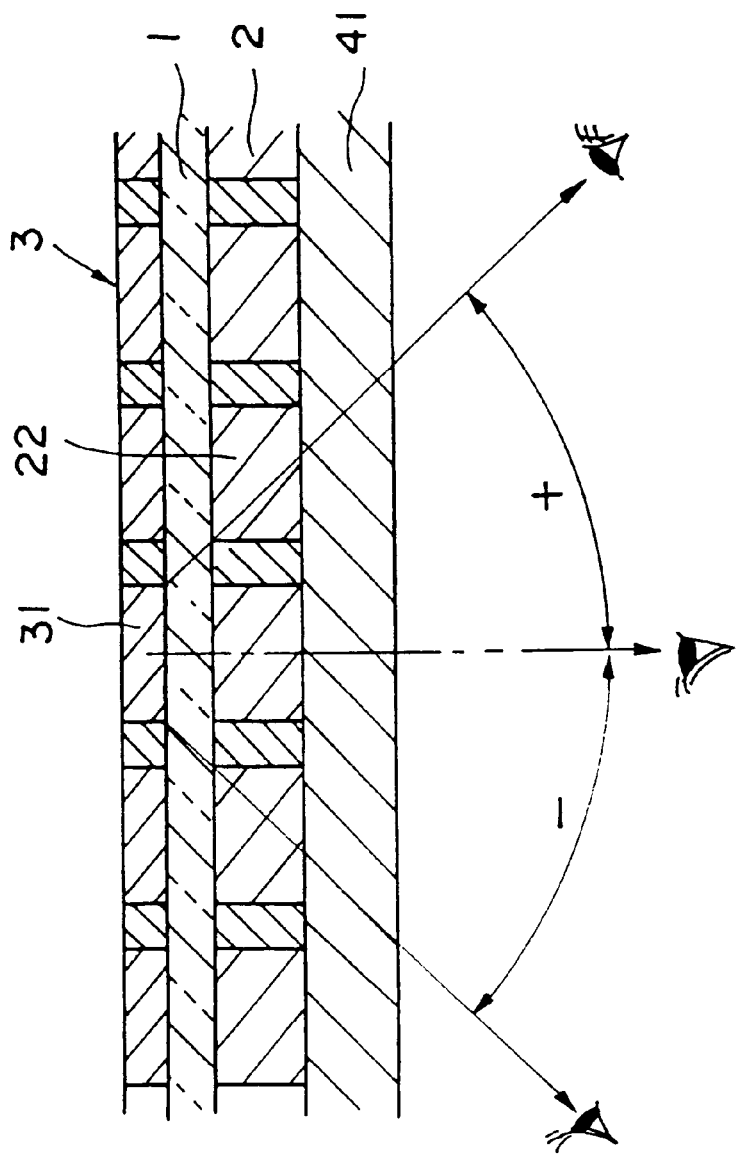
FIG. 4 is a sectional view for explaining the viewing angle of the present invention.

In order to explain the reason why the relation $T1 \geq T2$ must be satisfied, the relation with the viewing angle must be discussed. As shown in FIG. 4, said viewing angle is defined as each angle where a desired color of the light changes in case viewing angle is changed to the right and the left from the site in front of the organic EL display device.

Therefore, as shown in FIG. 4, in case the desired color of the light is changed at each angle shown with two inclined arrows originating the organic EL element 31, the viewing angle is expressed as a positive or negative angle value.

Figure 5:
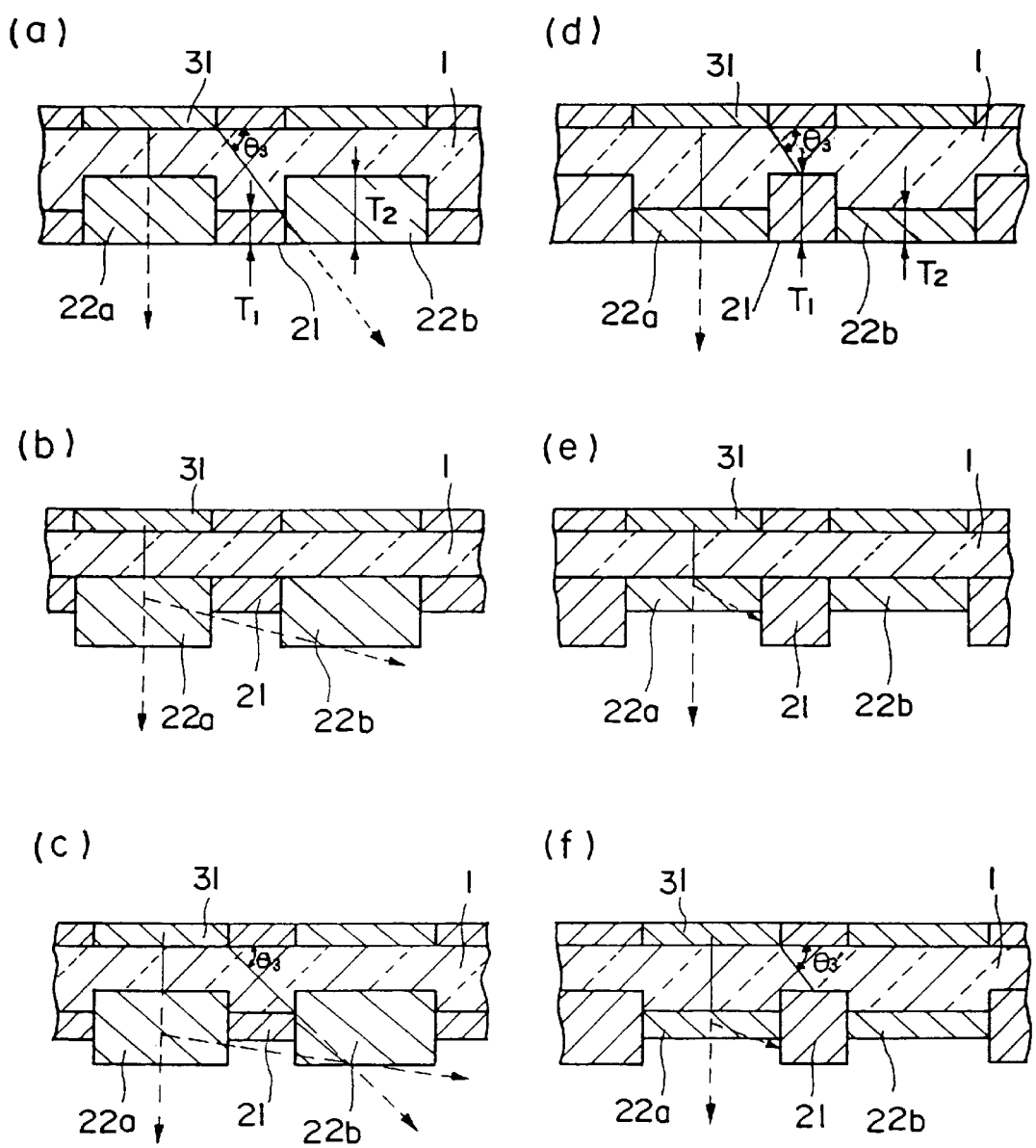
FIG. 5 is a sectional view for explaining the relation between the thickness of the shading layer T1 and that of the color modulating layer T2, in which (a),(b) and (c) show the case of T1<T2, and (d), (e) and (f) show the case of $T1 \geq T2$.

FIGS. 5a, 5b, and 5c show that the case the thickness T1 of a shading layer 21 is smaller than the thickness T2 of a color modulating layer 22a, i.e., T1<T2. On the other hand, FIGS. 5d, 5e, and 5f show that the case in which the thickness T1 of a shading layer 21 is larger than the thickness T2 of a color modulating layer 22a, i.e., T1>T2.

FIGS. 5a and 5d show the constitution in which the thickness of a transparent medium 1 is uneven, and each bottom surface of a shading layer 21 and a color modulating layer 22a (22b) having different thickness are smooth.

FIGS. 5b and 5e show the constitution in which the thickness of a transparent medium 1 is uniform, and a shading layer 21 and a color modulating layer 22a (22b) having different thickness are placed on the flat bottom surface of a transparent medium 1.

FIGS. 5c and 5f show the constitution in which the thickness of a transparent medium 1 is uneven, and each bottom surface of a shading layer 21 and a color modulating layer 22a (22b) having different thickness are rugged.

As the light emitted from the organic EL element 31 radiates isotropically (all azimuths) as shown in FIG. 5a, a part of the light enters into the color modulating layer 22b with an angle. The entrance of this part of the light is illustrated as an inclined arrow originating from the organic EL element 31 to a color modulating layer 22a (22b) in FIG. 5a.

In the constitution shown in FIG. 5a, as the thickness T1 of a shading layer 21 is smaller than the thickness T2 of a color modulating layer 22a, the light comes from the organic EL element 31 in an inclined direction might not be shaded adequately by a shading layer 21.

Therefore, the unshaded light enters into a part of the color modulating layer 22b adjacent, through a shading layer, to the shading layer with an angle ($\theta_3$).

As light enters into a color modulating layer 22b and light of an undesired color is emitted outside, said light of the undesired color and light of a desired color obtained from the color modulating layer 22a tend to mix, change in color could be observed in a very narrow angle, in case the angle to see the organic EL display device is changed to the right or left. Briefly, the viewing angle could become narrow, and this could cause unfavorable state.

On the other hand, in the constitution shown in FIG. 5d, as the thickness T1 of a shading layer 21 is larger than the thickness T2 of the color modulating layer 22a, the light having an angle ($\theta_3$) to a color modulating layer 22b among the light emitted from the organic EL element 31 is adequately shaded by a shading layer 21 and might not enter into a color modulating layer 22b.

Therefore, it becomes rare to emit the light of undesired colors in the color modulating layer 22b and to visualize the light of unintended colors.

As it becomes rare to mix the light of undesired colors and the light of unintended colors, it is possible to visualize the light of desired colors in a wide range of angle. Briefly, a favorable state with a wide range of viewing angle can be achieved.

In the constitution shown in FIG. 5b, as the thickness T1 of a shading layer 21 placed on the bottom surface of a transparent medium 1 having a uniform thickness is smaller than the thickness T2 of a color modulating layer 22a placed similarly, the light of the color decomposed or modulated in the color modulating layer 22a might not be adequately shaded with the shading layer 21.

Therefore, the unshaded light enters into a part of a color modulating layer 22b adjacent to the color modulating layer 22a with an angle. In FIG. 5b, the light that enters from a color modulating layer 22a into a color modulating layer 22b is illustrated as an inclined dotted arrow originating from the color modulating layer 22a.

In case the shading layer 21 does not function adequately in this way, the light of undesired colors obtained from the color modulating layer 22a and the light of unintended colors from color modulating layer 22b tend to mix, and a change in light in a very narrow range of angle could be observed in case the angle in order to see the organic EL element 31 is changed to the right or left.

Briefly, an unfavorable state, in which the viewing angle becomes narrow, could occur. Particularly in case a color modulating layer 22 isotropically fluoresces as a fluorescent layer, the viewing angle becomes narrow remarkably.

On the other hand, in the constitution shown in FIG. 5e, as the thickness T1 of a shading layer 21 is larger than the thickness T2 of a color modulating layer 22a, the light having an angle to the color modulating layer 22b among the light of the color decomposed or modulated in the color modulating layer 22a is adequately shaded with the shading layer 21 and might not enter into said color modulating layer 22b.

Therefore, it becomes rare to visualize light of an unintended color. The light of a desired color can be visualized with a wide range of angle by reducing mixing of the light of a desired color and that light of an unintended color. Briefly, a favorable state having a wide range of viewing angle can be achieved.

In the constitution shown in FIG. 5c, the light that comes in an inclined direction from the organic EL element 31 might not be adequately shaded by the shading layer 21, and the light of the color decomposed or modulated in a color modulating layer 22a might not be adequately shaded by the shading layer 21, either.

Therefore, as explained above referring to FIGS. 5a and 5b, the light of a desired color obtained from a color modulating layer 22a and the light of an undesired color tend to mix.

Thus, in case the angle to see the organic EL element 31 is changed to the right or left, a change in light in a very narrow range of angle could be visualized, the viewing angle would become narrow, and these could cause an unfavorable state.

On the other hand, in the constitution shown in FIG. 5f, the light that comes from the organic EL element 31 in an inclined direction can be adequately shaded with a shading layer 21, and the light having an angle to the color modulating layer 22b among the light decomposed or modulated in a color modulating layer 22a can also be adequately shaded with a shading layer 21.

Therefore, it becomes possible to visualize the light of a desired color in a wide range of angle by reducing mixing of the light of a desired color and the light of an unintended color. Briefly, a favorable state in which the viewing angle is larger is achieved.

In the organic EL display device 100 according to the present invention, a preferred |T1−T2| value is 2.0 μm or smaller, with T1 being the thickness of the shading layer 21; T2 being the thickness of the color modulating layer 22, both constituting a color-modulating member.

By constituting in this way, the roughness on the surface of the color modulating member is smoothed (flattened), and it is possible to reduce generation of defect or cross talk (luminescent at sites other than the predetermined sites) by disconnection or short circuit in the organic EL element 31.

Therefore, in the constitution shown in FIG. 2b in which a color modulating member (shading layer 21 and color modulating layer 22) is placed on a transparent supporting substrate 41, on which the organic EL element 31 is formed through a transparent medium 1, a desired value of |T1−T2| is equal to or smaller than 2.0 μm.

The reasons for constituting in this way will be explained below referring to FIGS. 19a, 19b, and 20.

Figure 19:
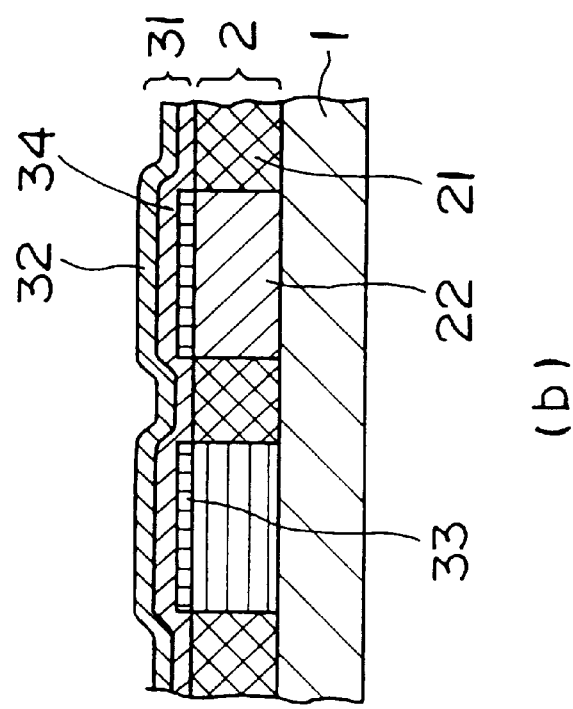
FIG. 19 is a diagram for explaining the influence of roughness on the surface in a color modulating member (Part 1), in which (a) shows the case where the roughness of the surface in a color modulating member is large and (b) shows the case where the roughness on the surface in a color modulating member is small.
Figure 19:
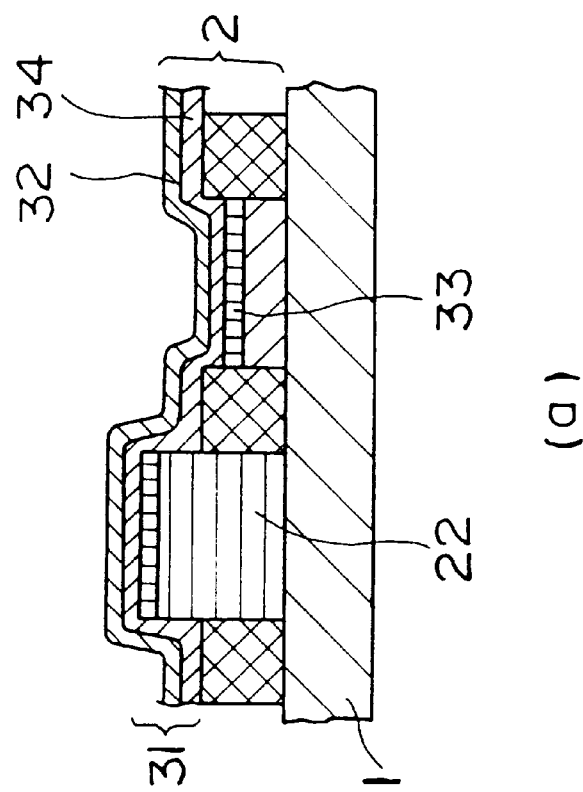
Figure 20:
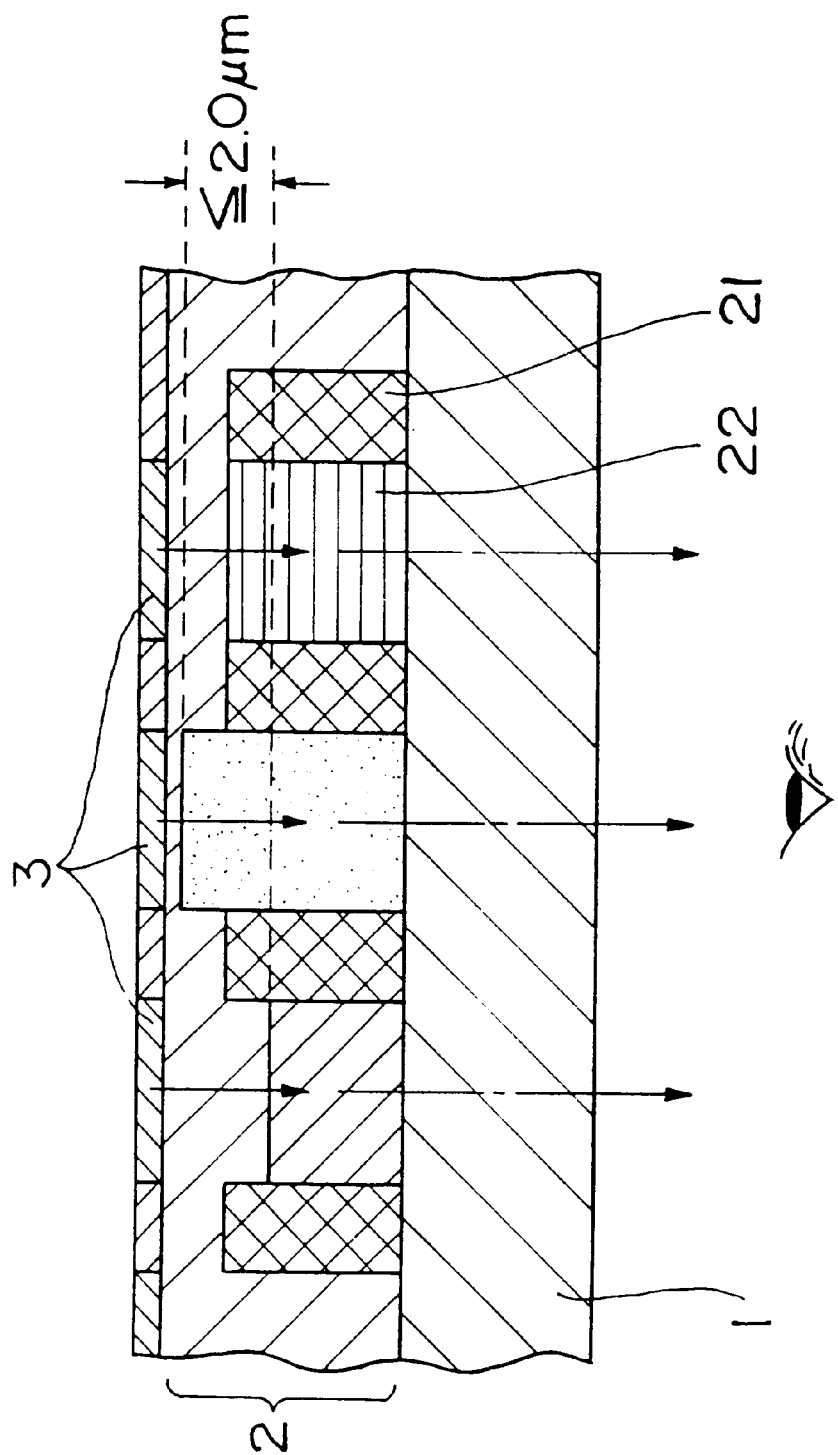
FIG. 20 is a diagram for explaining the influence of roughness on the surface in a color modulating member (Part 2).

First, FIGS. 19a and 19b illustrate the case in which the organic EL element 31 is contacted with each color modulating layer 22 of a color modulating member 2.

The organic EL element 31 is constructed in such a way that an organic layer 34 (mainly emitting layer) is placed between two electrodes 32 and 33, wherein said two electrodes 32 and 33 are each stripe-form, and they intersect each other.

FIG. 19a illustrates the case in which roughness on the surface of the color modulating member is large (|T1−T2|>2.0 μm). In this case, the roughness on the surface gives warp to the organic EL element 31. This could cause a leak current between the two electrodes 32 and 33 in the organic EL element 31, or defect or cross talk particularly by disconnection of electrode 32 or the like, and reduce the yield in production of the organic EL display device.

On the other hand, FIG. 19b illustrates the case in which roughness of the surface of the color modulating member is small (|T1−T2|≦2.0 μm). In this case, the roughness of the surface would rarely give warp to the organic EL element 31 which is a thin coat.

This point will be explained in more detail, based on the result shown in Table 1 below. Table 1 summarizes the results of test concerning relation between the magnitude of the roughness of the surface of the color modulating member 2 in FIGS. 19a and 19b, i.e., |T1−T2| and generation of defect parts (non-luminescent part) and cross talk.

Concretely, various color modulating member 2 were prepared by dependently changing the thickness T1 of the shading layer 21 and the thickness T2 of the color modulating layer 22. The organic EL display device was constructed as shown in FIG. 20 using these color modulating member 2, and generation of defect and cross talk were observed visually when said organic EL display device was driven, wherein the frequency (frequent or rare) of defect and cross talk in the organic EL display device was judged according to the following criteria:

Rare: the generation of defect or cross talk were observed in 30% area or less of the overall display area Frequent: the generation of defect or cross talk were observed in more than 30% area of the overall display area As easily understood from Table 1, if the roughness of the surface of the color-modulating member, i.e., |T1−T2| is equal to or smaller than 2.0 μm, frequency of defect and generation of cross talk can be reduced. Therefore, it is considered that the magnitude of the roughness of the surface of the color modulating member 2 influences the yield of production of the organic EL display device.

TABLE 1

| Roughness of the surface | Frequency of defect | Frequency of generation of cross talk |
| --- | --- | --- |
| 0.2 | Rare | Rare |
| 0.5 | Rare | Rare |
| 1.0 | Rare | Rare |
| 2.0 | Rare | Rare |
| 3.0 | Frequent | Frequent |
| 4.0 | Frequent | Frequent |
| 5.0 | Frequent | Frequent |

Figure 21:
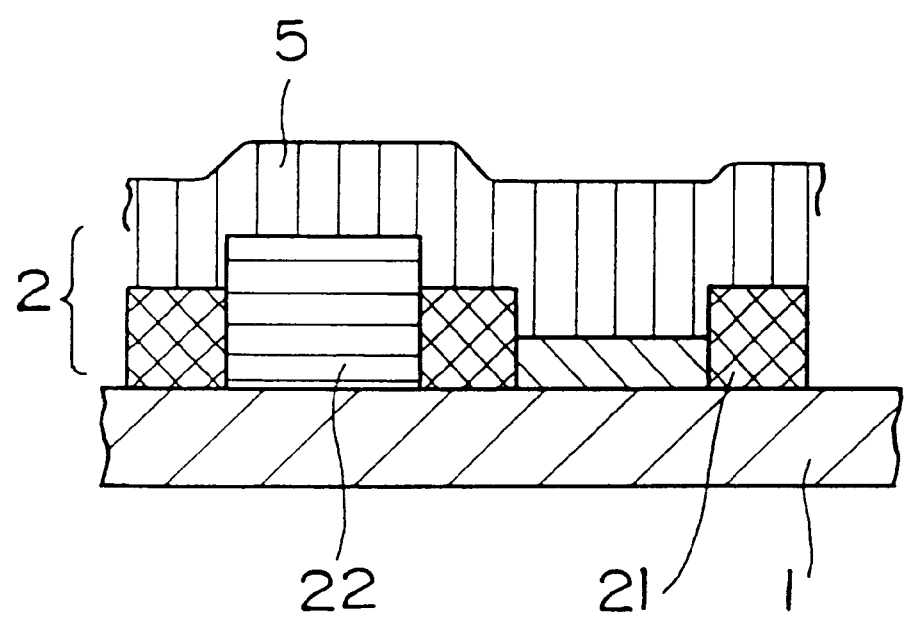
FIG. 21 is a diagram for explaining the case where a transparent flattened layer is overlaid on a color-modulating member.

As shown in FIG. 21, the roughness of the surface of the color modulating member 2 can be reduced (flattened) by overlaying a transparent flattened layer 5, i.e., a transparent medium 1 on a color modulating member 2 shown in FIG. 19a. However, in case the thickness of the transparent flattened layer 5 is too large, the light might leak from the organic EL element (not shown), the color shift (color-mixing) might occur, and the viewing angle might become narrow. Therefore, it is preferred to select the thickness of the transparent flattened layer 5, taking (1) reduction of roughness on the surface of the color modulating member 2, (2) color shift, and (3) balance into account although the thickness depends on the fineness of the color modulating member 2 and the luminescent member 3.

Then, the relation between the area (S1) of the luminescent region of an organic EL element in the organic EL display device 100 according to the present invention and the area (S2) of the region of the color modulating layer, will be explained below. As mentioned above, it is preferred that the organic EL display device satisfies the relation S2≧S1. The region of the color modulating layer becomes possible to practically cover the luminescent region by satisfying such a relation concerning area.

Figure 6:
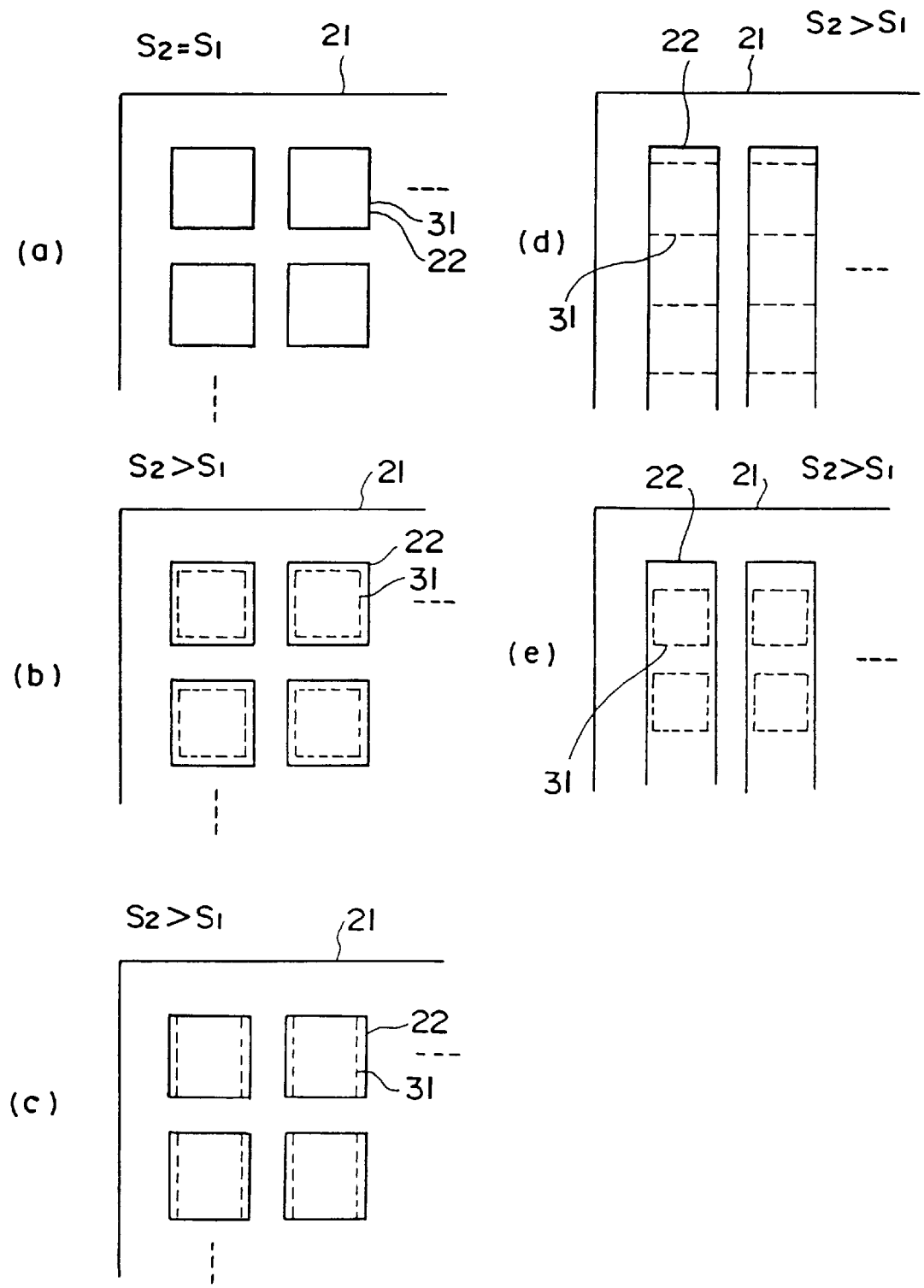
FIG. 6 illustrates the relation $S2 \geq S1$ of the present invention.

Concretely, it is preferred in the present invention to adopt such constitution as shown in FIGS. 6a–6e. FIG. 6a illustrates the case in which the area of region of the color modulating layer 22 is same as the area of the luminescent region of the organic EL element 31, i.e. S2=S1. The area of the region of the color modulating layer 22 is shown with solid lines, and the area of the luminescent region of the organic EL element 31 is shown with dotted lines. Therefore, in the case of FIG. 6a, S2=S1, the solid lines showing the color modulating layer 22 and the dotted lines showing the luminescent region are superimposed.

FIGS. 6b–6e illustrates the case in which the area of region of the color modulating layer 22 is larger than the area of the luminescent region of the organic EL element 31, i.e., S2>S1, and the former region includes the latter. Therefore, in these cases, S2>S1, the dotted line showing the luminescent region is shown inside the solid line showing the color modulating layer 22.

By constituting an organic EL display in such a way that such relation concerning area is satisfied, the region of the color modulating layer can easily cover the luminescent region, and can easily prevent color-mixing and generation of light of an unnecessary color.

The reasons why generation of unnecessary light can be prevented by satisfying the relation S2≧S1, will be explained in more detail below referring to FIGS. 7a and 7b.

Figure 7:
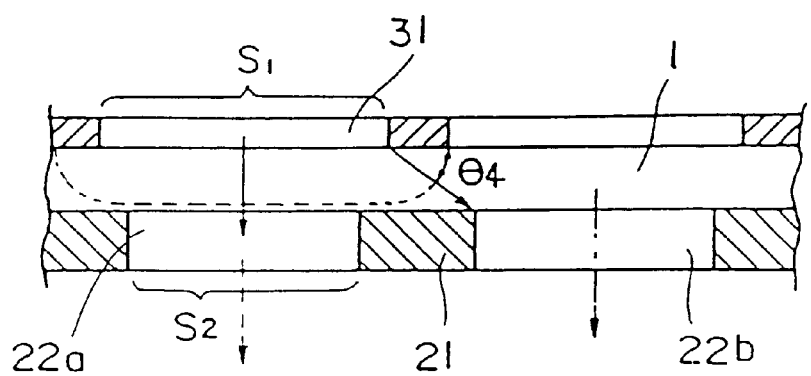
FIG. 7 is a sectional view for explaining the relation between the area of luminescent region of the organic EL element S1 and that of the color modulating layer S2, in which (a) shows the case of S1>S2, and (b) shows the case of $S1 \leq S2$.
Figure 7:
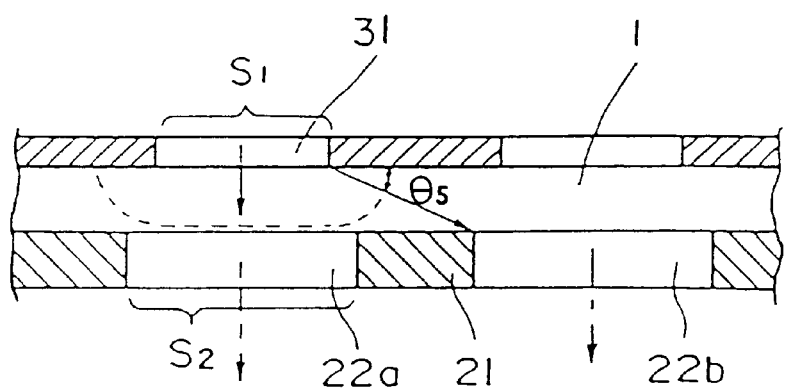

FIG. 7a illustrates a front view of a cross section of an organic EL display in the case of S1>S2. As explained above, the light emitted from the organic EL element 31 radiates isotropically and becomes light having an isotropic intensity distribution. Therefore, in the case of S1>S2 as shown in FIG. 7a, the light could enter with a large angle of incidence $\theta_4$ not only into a color modulating layer 22a but also into the color modulating layer 22b adjacent to it. As a result, the color is visualized mixing, and it becomes relatively difficult to visualize the light of a desired color.

In case the relation S2≧S1 is satisfied as shown in FIG. 7b, however, the angle of incidence $\theta_5$ becomes small, and the intensity of the light that enters into the color modulating layer 22b becomes relatively small. As a result, mixing of color is reduced, and it becomes possible to selectively visualize the light of a desired color.

Therefore, in case multi-color and monochrome display is carried out in the organic EL display device 100 according to the present invention, a practical organic EL display device that rarely generates color shift (color-mixing) can be provided by satisfying the relation S2≧S1.

2. Each Component
(1) Color-modulating Layer

Figure 8:
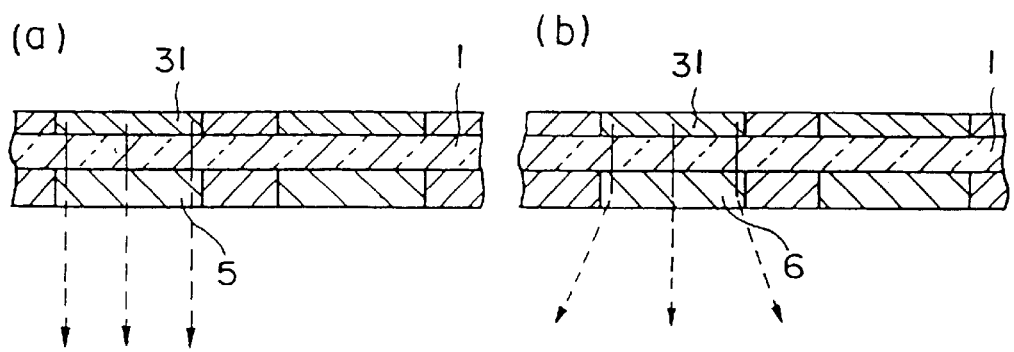
FIG. 8 is a sectional view for explaining the color modulating layer used in the present invention, in which (a) shows the case where a color filter was used and (b) shows the case where a fluorescent layer was used.

For the color modulating layer according to the present invention, (1) a color filter 5 that decomposes or cuts the light of the organic EL element 31 or (2) a fluorescent layer 6 that modulates the light of the organic EL element 31 to fluorescence with a different color (color with longer wavelength), can be used as shown e.g. in FIGS. 8a and 8b.

In case a color filter 5 is used, the loss of light is relatively high because it takes out light functionally by decomposing or cutting. In case e.g. white luminescence is decomposed into three primary colors (red, green, blue), brightness of white color might be reduced to ca. 1/3.

On the other hand, in case a fluorescent layer 6 is used, it has a function to modulate light into fluorescence having a longer wavelength. If a fluorescent pigment absorbs at a yield of 80% and it fluoresces at a fluorescent yield of 80%, as a result it can modulate the light at a yield of 64%. Such fluorescent pigment is practically known.

Therefore, it is more preferred to use a fluorescent layer 6 in the color modulating layer in the organic EL display device according to the present invention. In addition, it is more preferred to use a fluorescent layer 6 in order to enlarge the viewing angle and to enhance the visual-check property as the fluorescent layer 6 radiates per se isotropically.

1) Color Filter

Materials for the color filters used for color modulating layers will be explained below. Materials for said color filters include e.g. the following pigments or a solid in which said pigments are dissolved or dispersed in a binder resin.

Red (R) Pigments:

Perylene-based pigments, rake pigments, azo-based pigments, quinacridone-based pigments, anthraquinone-based pigments, anthracene-based pigments, isoindolin-based pigments, iso-indolinone, or the like, and a mixture of two or more of these pigments can be used.

Green (G) Pigments:

Polyhalogenated phthalocyanine-based pigments, polyhalogenated copper phthalocyanine-based pigments, triphenylmethane-based basic dyes, iso-indolinone-based pigments, or the like, and a mixture of two or more of these pigments can be used.

Blue (B) Pigments:

Copper phthalocyanine-based pigments, indanthrone-based pigments, indophenol-based pigments, cyanine-based pigments, dioxazine-based pigments, or the like, and a mixture of two or more of these pigments can be used.

On the other hand, it is preferred to use transparent materials (transmittance is higher than 50% in visible light region) as a binder resin for the materials of the color filters. They includes transparent resins (polymers) such as polymethylmethacrylate, polyacrylate, polycarbonate, polyvinylalcohol, polyvinylpyrrolidone, hydroxyethylcellulose, and carboxymethylcellulose, and a mixture of two or more of these polymers.

It is preferred to use photopolymers to which photolithography can be applied in order to plane and discretely place a color modulating layer in a color filter. They include photoresist materials having a reactive vinyl group such as acryl-based materials, methacryl-based materials, polyvinylcinnamic acid-based materials, and cyclic rubber-based materials (composition composed of polyisoprene, polycyclohexene, and aromatic bis azide), and a mixture of two or more of these materials.

In addition, printing inks (medium) using a transparent resin can be used in order to plane and discretely place a color modulating layer in a color filter. They include a composition composed of a monomer, an oligomer, and a polymer of polyvinylchloride resin,a polychlorovinylidene resin, a melamine resin, a phenol resin, an alkyd resin, an epoxy resin, a polyurethane resin, a polyester resin, a maleic acid resin, and a polyamide resin, and a transparent resin such as polymethylmethacrylate, polyacrylate, polycarbonate, polyvinylalcohol, polyvinylpyrrolidone, hydroxyethylcellulose, and carboxymethylcellulose, and a mixture of two or more of these materials.

In case the color modulating layer in the color filter is mainly composed of pigments, the color modulating layer can be formed by using the vacuum deposition or sputtering method through a mask of a desired color filter pattern.

On the other hand, in case the color modulating layer in a color filter is composed of a pigment and a binder resin, a liquid is prepared by mixing, dispersing, and solubilizing the pigment, said resin, and an appropriate solvent in general. Then using the liquid, a coat is formed by a method such as the spin-coat method, the roll-coat method, the bar-coat method, and the cast method. Then, a color modulating layer can be formed (1) by patterning with the desired color coat pattern by the photolithography or by patterning the desired color coat pattern by printing or the like, and (2) by hardening with heat.

Preferred transmittance of each color filter according to the present invention is:

R: 50% or more at 610 nm
G: 50% or more at 545 nm
B: 50% or more at 460 nm

In case particularly the color modulating layer of the color filter is composed of pigments and a binder resin, preferred concentration of the pigments is in such a range that the color filter can be patterned without trouble and the luminescence of the organic EL element can be adequately transmitted. Therefore, a preferred content of pigments per a color filter coat including a binder resin used is 5–50 wt. % although it depends on the kind of the pigment.

2) Fluorescent Layer

For the color modulating layer according to the present invention, a fluorescent layer can be used as mentioned above. Said fluorescent layer includes solid that is composed of e.g. only fluorescent pigments and resins(dye), in which fluorescent pigments are dissolved or dispersed in a pigment resin and/or a binder resin.

Fluorescent pigments which modulate the near-ultraviolet to violet luminescence of an organic EL element to blue luminescence include stilbene-based pigments such as 1,4-bis(2-methylstyryl)benzene (Bis-MSB), trans-4,4'-diphenylstilbene (DRS) and coumarin-based pigments such as 7-hydroxy-4-methylcoumarin (Coumarin 4), and a mixture of two or more of these pigments.

Fluorescent pigments which modulate the blue to blue green luminescence of an organic EL element to green luminescence include coumarin-based pigments such as 2,3,5,6-1H,4H-tetrahydro-8-trifluoromethylquinolizino(9,9a,1-gh)coumarin (Coumarin 153), 3-(2'-benzothiazolyl)-7-diethylaminocoumarin (Coumarin 6), and 3-(2'-benzimidazolyl)-7-N,N-diethylaminocoumarin (Coumarin 7), and naphthalimide-based pigments such as Basic Yellow 51, Solvent Yellow 11, and Solvent Yellow 116, and a mixture of two or more of these pigments.

Fluorescent pigments which modulate the blue to green luminescence of an organic EL element to orange to red luminescence include cyanine-based pigments such as 4-dicyanomethylene-2-methyl-6-(p-dimethylaminostyryl)-4H-pyran (DCM), pyridine-based pigments such as 1-ethyl-2-(4-(p-dimethylaminophenyl)-1,3-butadienyl)-pyridinium-perchlorate (Pyridine 1), Rhodamine-based pigments such as Rhodamine B and Rhodamine 6G, and oxazine-based pigments, and a mixture of two or more of these pigments.

In addition, various dyes (direct dyes, acidic dyes, basic dyes, dispersion dyes, or the like) can also be used if they exhibit fluorescence.

Pigments prepared by blending the above-mentioned fluorescent dyes in a pigment resins such as polymethacrylic acid ester, polyvinylchloride, vinylchloride-vinyl acetate co-polymer, an alkyd resin, an aromatic sulfonamide resin, an urea resin, a melamine resin, and a benzoguanamine resin can also be used.

These fluorescent pigments can be used solely or as a mixture. As the fluorescence modulation efficiency to red luminescence is low in particular, the efficiency can be enhanced by mixing those pigments.

In the organic EL display devices according to the present invention, white luminescence can be obtained by mixing a fluorescent pigment that modulates to above-mentioned green luminescence and a pigment that modulates to orange to red luminescence and by transmitting a part of the blue to blue-green light from the organic EL element.

For a binder resin, transparent materials having a transmittance over 50% are preferred. They include transparent resins (polymers) such as polymethylmethacrylate, polyacrylate, polycarbonate, polyvinylalcohol, polyvinylpyrrolidone, hydroxyethylcellulose, and carboxymethylcellulose, and a mixture of two or more of these resins.

In order to plane and discretely place the fluorescent layer, it is preferred to use the photoresins to which photolithography can be applied. They include light-hardening resist materials having a reactive vinyl group such as acrylic acid-based resins, methacrylic acid-based resins, polycinnamic acid vinyl-based resins, and circularized rubber-based resins composed of polyisoprene, polycyclohexene, and aromatic bisazide, and a mixture of two or more of these resins.

In case the printing method is used, a printing ink (medium) using transparent resins is selected. The transparent resins include a monomer, an oligomer, or a polymer of a polyvinylchloride resin, a melamine resin, phenol resin, an alkyd resin, an epoxy resin, a polyurethane resin, a polyester resin, a maleic acid resin, and a polyamide resin, and a polymethylmethacrylate resin, a polyacrylate resin, a polycarbonate resin, a polyvinylalcohol resin, a polyvinylpyrrolidone resin, a hydroxyethylcellulose resin, and a carboxymethylcellulose resin, and a mixture of two or more of these transparent resins.

In case the fluorescent layer is mainly composed of fluorescent pigments, a coat is formed by the vacuum deposition or sputtering method through a mask of a desired fluorescent layer pattern. On the other hand, in case the fluorescent layer is composed of a fluorescent pigment and a resin, a coat is formed by preparing liquid by mixing, dispersing, or dissolving a fluorescent pigment, a resin, and an appropriate solvent, and by applying a method such as the spin coat method, the roll coat method, the bar coat method, and the cast method. Then, generally a desired fluorescent layer pattern is patterned by photolithography, screen printing, or the like.

The thickness of the fluorescent layer must be in such a range that the thickness does not prevent functions to adequately absorb the luminescence of the organic EL element and to fluoresce. Although the range depends more or less on the fluorescent pigment, the range is usually 10 nm–1 mm. Preferred range is 10 nm–1 mm, more preferred range is 5–100 $\mu$m and the most preferred range is 10–50 $\mu$m.

Compared with the thickness of the color filter, the thickness of the fluorescent layer is important in general. The reason for this is that it must absorb the luminescence of the organic EL element adequately, although the fluorescent pigments are more sensitive to the concentration than the color filter pigments, and the fluorescence is stronger in case they are dispersed or dissolved in a pigment resin or a binder resin at lower concentration.

Briefly, it is generally necessary for the fluorescent layer to have the absorbance of the light at a level of a color filter. Accordingly, if the extinction coefficient of the pigment is constant according to the equation (1) showing the Lambert-Beer law, it is preferred that the fluorescent layer is thick in order to enhance the fluorescence property (high absorbance of the light ).

The Lambert-Beer law $$A = \epsilon \cdot c \cdot l \tag{1}$$

A: absorbance $\epsilon$: extinction coefficient c: concentration of pigment l: thickness Although the concentration of a fluorescent pigment in the fluorescent layer including a pigment resin and/or a binder resin depends on the kind of the fluorescent pigment, its usual range is $1\times10^{-4}$–$1\times10^{0}$ mol/kg, its preferred range is $1\times10^{-3}$–$1\times10^{-1}$ mol/kg, and its more preferred range is $1\times10^{-2}$–$5\times10^{-2}$ mol/kg.

(2) Shading Layer

In the present invention, a shading layer is used in order to shade undesired light emitted from an organic EL element, prevent color-mixing in the organic EL display device, and improve the viewing angle property.

The thickness of the shading layer is usually within the range of 10 nm–1 mm, preferably 1 $\mu$m–1 mm, and more preferably 5–100 $\mu$m. In case the color modulating layer is a fluorescent layer, a preferred thickness of the shading layer is thicker than the color filter. As more preferred thickness of the fluorescent layer is within the range of 5–100 $\mu$m, the optimal thickness of the shading layer is thicker than 5 $\mu$m, taking the relation $T2 \geq T1$ concerning the thickness T1 of the color modulating layer (fluorescent layer) and the thickness T2 of the shading layer into account.

Although the surface shape of the shading layer can be a grating shape or a stripe-shaped, the former is preferred (See FIGS. 1b and 1c).

Figure 9:
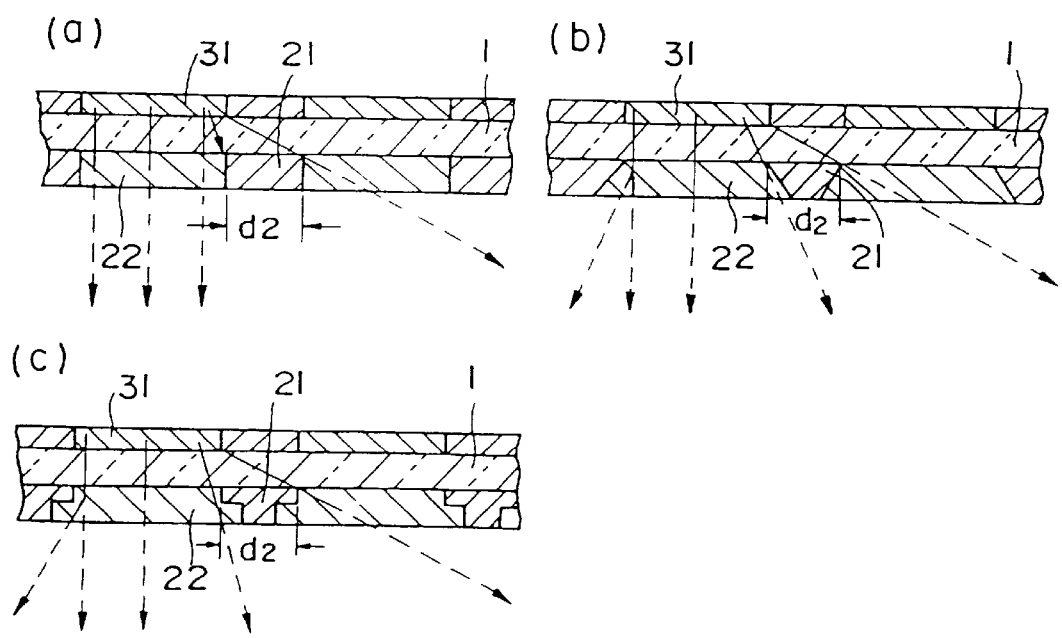
FIG. 9 is a sectional view for explaining the form of the shading layer used in the present invention, in which (a) shows a rectangular form, (b)shows an inverted trapezoidal form and (c) shows a T-shaped form.

Although the cross-section of a shading layer 21 is rectangular as shown in FIG. 9a in general, it is preferred to form the cross-section in such a way that the width of the shading layer 21 becomes narrow gradually or stepwise from the side of the transparent medium to the opposite side in order to improve the visual check property by keeping the viewing angle property, enlarging the opening of the color modulating layer 22, taking good advantage of the light of the organic EL element 31, and enhancing the brightness of the organic EL display device.

Briefly, as shown in FIGS. 9b and 9c, if the width of the shading layer 21 in the side of the transparent medium is different from that of the opposite side, and the latter is smaller than the former (d2), the visual check property can be improved by taking advantage of the light that was shaded in the case of the rectangular shape, enlarging the opening of the color modulating layer 22, and enhancing the brightness. FIG. 9b illustrates the case of a inverted. trapezoid; FIG. 9c illustrates the case in which it is T-shaped.

The transmittance of the shading layer is preferably 10% or less, more preferably 1% or less in a visible region, i.e., 400–700 nm wavelength that emits the light from the organic EL element or the color modulating layer. In case it is higher than 10%, the light of the organic EL element or the light from the color modulating layer might enter not only into the frontal color modulating layer but also into the adjacent color modulating layer, and the shading layer could not function adequately.

Figure 10:
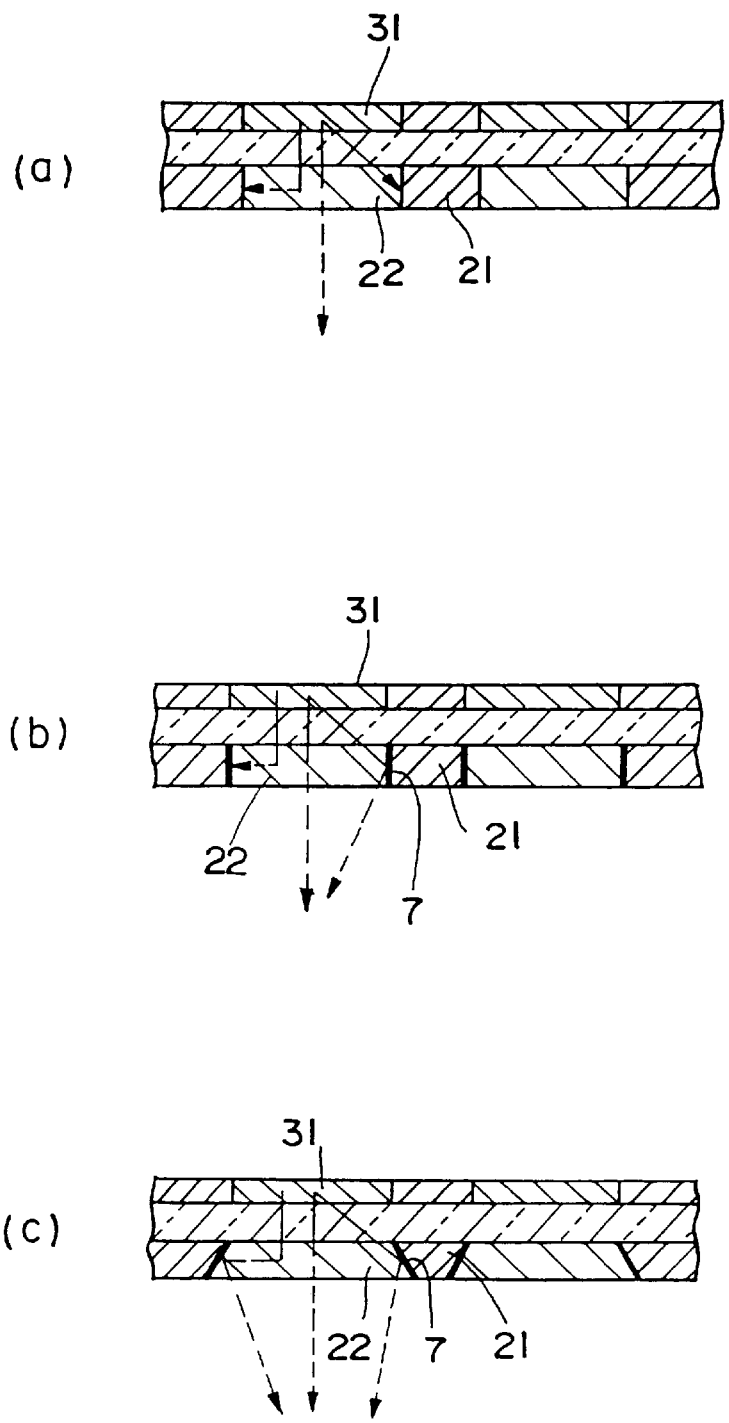
FIG. 10 is a sectional view schematically showing the reflecting part of the shading layer in the side surface that contacts with the color modulating layer, in which (a) shows the case where there is no reflecting part, (b) shows the case where a reflecting part was provided in a rectangular shading layer, and (c) shows the case where a reflecting part was provided in a inverted trapezoidal layer.

In addition, the reflectance efficiency of light in a visible region of 400–700 nm wavelength of the shading layer at the side surface that contacts at least with the color modulating layer is preferably higher than 10%, more preferably 50% or more in order to improve the visual check property by providing a reflectance part 7 as shown in FIG. 10b, effectively taking out the light from the color modulating layer 22, and enhancing the brightness of the organic EL display device.

In addition, if a reflectance part 7 is provided, as shown in FIG. 10c, and the shape of the shading layer 21 is a inverted. trapezoidal shape, it is more effective. FIG. 10a illustrates the case in which any reflectance part is not provided.

Then, the materials for the shading layer will be explained below. Said materials include the following metals and black pigments.

The metals include Ag, Al, Au, Cu, Fe, Ge, In, K, Mg, Ba, Na, Ni, Pb, Pt, Si, Sn, W, Zn, Cr, Ti, Mo, Ta, and stainless steel, and a mixture of two or more of these metals and the alloy. Oxides, nitrides, sulfides, nitrates, and sulfates of those metals can also be used. Carbon may be contained in the metals.

From the materials for the above-mentioned shading layer, the pattern (placed plane and discretely) of the shading layer can be formed in such a way that a transparent substrate coat is formed by the method such as the sputtering method, the deposition method, the CVD method, the ion plating method, the electrodeposition method, the electric plating method, and the chemical plating method, and patterning is carried out by the photolithography or the like.

As the black pigments, pigments in which carbon black, titanium black, aniline black, and the above-mentioned color filter pigment are mixed to be black can be used.

A patterned shading layer can be formed by patterning the solid that was prepared by dissolving or dispersing these black pigments or the above-mentioned metallic materials in the binder resin that was used in the color modulating layer, by the method similar to the method used in the color modulating layer.

Next, the shape of a shading layer will be explained. Concerning the shape of said shading layer, it is not limited to but it is preferred that the width of the transparent medium side becomes gradually or stepwise large from the opposite side.

The shading layer having this shape can be prepared by controlling (1) the exposure energy by the UV light on the coat surface (transparent medium side) and (2) the development condition after a coat of a shading layer-forming material, in which a black pigment is dissolved or dispersed in a binder resin such as light-hardening resist, is formed on a substrate. Concretely, the amount of exposure is reduced than the condition to form a rectangular shading layer, and the concentration of the developing agent and the temperature are raised, or the time for development is lengthened. As it is originally a shading layer, even the light of a UV region is hardly transmitted, hardening progresses more in the nearer part to the exposed surface of the shading layer, and hardening progress less in the farther part to the exposed surface of the shading layer. Therefore, as the far part (the opposite side of the transparent medium) from the exposed surface is dissolved by treatment of a developing agent, a desired shape of a shading layer can be obtained.

In case a metal is used as the shading layer, a rectangular or trapezoid pattern is formed e.g. on a substrate with light-dissolving resist (posi-resist), a metal coat is formed, the resist pattern is lifted off, and a pattern of a shading layer having a desired shape can be formed in the gap part of the pattern of the resist.

In addition, on the side surface that contacts at least with the color modulating layer of the patterned shading layer, the reflectance coefficient in a visible region of the wavelength of 400–700 nm is preferably 10% or more, more preferably 50% or more.

By controlling the reflectance coefficient within such a region, the light from the color modulating layer 22 can be effectively taken out, the brightness of the organic EL display device can be enhanced, and the visual check property can be improved.

The reflectance coefficient of light can be controlled by using said metallic material as a pattern of the shading layer directly, or by forming a coat of said metal on a pattern of the shading layer that is composed only of a black pigment or of a black pigment and a binder resin by a method such as the sputtering method, the deposition method, the CDV method, and the ion plating method. In the latter case, as it is necessary to selectively form a coat on the side surface of the shading layer, a resist of a thin layer is formed except on the side surface. Later, a desired shading layer can be obtained by forming a coat with the above mentioned metallic material by the oblique coat formation, and by removing a metallic coat that was formed in an unnecessary part by lifting off the resist. In this case, the thickness of the coat formed is 0.01–1 μm, preferably 0.05–0.5 μm in view of evenness and adhesion.

The coat surface reflection coefficients (ideal ones) of main metallic materials are summarized in Table 2.

TABLE 2

| Metal | Reflection coefficient (wavelength in nm) |
|---|---|
| Ag | 97.9% (500) |
| Al | 91.6% (546) |

TABLE 2-continued

| Metal | Reflection coefficient (wavelength in nm) |
|---|---|
| Au | 50.4% (500) |
| Cu | 62.5% (500) |
| Fe | 60.7% (570) |
| Ge | 46.6% (516) |
| In | 51.5% (500) |
| K | 88.6% (546) |
| Mg | 84.3% (546) |
| Na | 98.2% (546) |
| Ni | 54.6% (440) |
| Ni | 60.7% (540) |
| Pb | 67.5% (700) |
| Pt | 59.1% (589) |
| Si | 37.5% (515) |
| W | 43.1% (472) |
| Zn | 82.5% (545) |

Although the reflection coefficients of these metals were measured at specified wavelengths, the value is not so much changed in a wavelength region of 400–700nm. Other materials having a reflection coefficient of 10% or more can also be used.

(3) Transparent Medium

The transmittance of the transparent medium, which mediates between an organic EL element and a color-modulating and shading layers at 400–700 nm, is preferably 50% or more. In addition, it is more preferred that the transparent medium has an electrically insulating property.

The transparent medium can be constructed in mono-layer or multi-layer. The transparent medium can be the solid phase, the liquid phase, or the gas phase.

In case a transparent medium is the solid phase such as a polymer layer, the polymers include acrylate-based polymers and methacrylate-based polymers one having methacrylate-based reactive vinyl groups such as light-hardening resins and heat-hardening resins.

The polymers also includes a monomer, a dimer, and a polymer of melamine resin, a phenol resin, an alkyd resin, an epoxy resin, a polyurethane resin, a polyester resin, a maleic acid resin, and a polyamide resin, and transparent resins such as polymethylmethacrylate, polyacrylate, polycarbonate, polyvinylalcohol, polyvinylpyrrolidone, hydroxyethylcellulose, and carboxymethylcellulose, and a mixture of two or more of these transparent resins.

The polymers also include various fluorinated polymers.

In case an inorganic oxide layer is the solid phase transparent medium, the inorganic oxides include silicon oxide ($SiO_2$), aluminum oxide ($Al_2O_3$), titanium oxide ($TiO_2$), yttrium oxide ($Y_2O_3$), germanium oxide ($GeO_2$), zinc oxide (ZnO), magnesium oxide (MgO), calcium oxide (CaO), boron oxide ($B_2O_3$), strontium oxide (SrO), barium oxide (BaO), lead oxide (PbO), zirconium oxide ($ZrO_2$), sodium oxide ($Na_2O$), lithium oxide ($Li_2O$), and potassium oxide ($K_2O$), and a mixture of two or more of these oxides.

The inorganic oxide layers includes a glass plate, which is also used as a transparent supporting substrate shown in FIG. 2a.

The glass plate includes the soda-lime glass, the barium- and strontium-containing glass, the lead glass, the aluminosilicate glass, the borosilicate glass, and the barium borosilicate glass, and a mixture of two or more of these glasses. For the inorganic oxide layer, materials which mainly contain an inorganic oxide can be used even if nitrides such as $Si_3N_4$ are contained.

In order to attach an organic EL element to a transparent substrate 41 that formed a color modulating layer 22 and a shading layer 21 shown in FIG. 2a, the following adhesives can be used: light-hardening and heat-hardening adhesives such as acrylic acid-based oligomer and methacrylic acid-based oligomer having a reactive vinyl group, moisture-hardening adhesives such as 2-cyanoacrylic acid ester, and heat- and chemical hardening (two-liquid type) adhesives such as epoxy-based oligomer.

In case the gas phase and liquid phase are the transparent medium, inert gases such as nitrogen and argon, and inert liquids such as fluorinated hydrocarbon and silicone oil can be used. Also, the transparent medium can be constructed by the vacuuming process. In case these liquid materials are used as a transparent media, the layer(coated) of the transparent media is formed by the methods such as the spin coat method, the roll coat method, and the cast method. In case these solid materials are used as transparent media, the layer is formed by the methods such as sputtering, deposition, CVD, and ion plating. Inert liquids and inert gases are enclosed by sealing outside the luminescent region of the organic EL element.

It is preferred that the interface where these transparent media contact with the organic EL element is the above-mentioned inorganic oxide layer, inert liquid, or inert gas because they can intercept water and oxygen which promote deterioration of the organic EL element.

In the transparent medium, it is preferred that the difference between the refraction index n1 of the transparent medium that contacts particularly with the color modulating layer and the refractive index n2 of the color modulating layer is as small as possible, because the light of the organic EL element is not reflected on the color modulating layer but enters into it, and more preferably that the relation $|n1-n2|<0.4$ is satisfied. In the case of $|n1-n2|\geq 0.4$, as shown in the relation (2) below, the reflection of light of the organic EL element becomes large at the interface of the color modulating layer, and brightness of the light taken out from the color modulating layer might be lowered finally.

The refraction indexes n1 of main materials used in the main transparent media and the refraction indexes n2 of main resins and binder resins which are used in the color modulating layer are summarized in Tables 3 and 4, respectively.

TABLE 3

| Transparent medium | n1 (wavelength) |
|---|---|
| Methyl methacrylate resin | 1.49 (589 nm) |
| $SiO_2$ | 1.54 (589 nm) |
| $B_2O_3$ | 1.77 (546 nm) |
| Glass | 1.52 (589 nm) |
| Tetrafluoroethylene resin | 1.35 (589 nm) |
| Fluorinated hydrocarbon (FC70) | 1.30 (589 nm) |
| Silicone oil | 1.40 (589 nm) |
| Nitrogen | 1.00 (546 nm) |
| Argon | 1.00 (546 nm) |
| Air | 1.00 (546 nm) |
| Vacuum | 1.00 (546 nm) |

TABLE 4

| Color-modulating layer (pigment resin, binder resin) | n2 (wavelength) |
| --- | --- |
| Vinylchloride resin | 1.54 (589 nm) |
| Chlorovinylidene resin | 1.60 (589 nm) |
| Vinyl acetate resin | 1.45 (546 nm) |
| Polyethylene resin | 1.51 (589 nm) |
| Polyester resin | 1.52 (589 nm) |
| Polystylene resin | 1.59 (589 nm) |
| Methyl methacrylate resin | 1.49 (589 nm) |
| Melamine resin | 1.60 (589 nm) |

As these reflective indexes do not change much in a visible wavelength region of 400–700 nm, the values in the table are shown as representative ones.

The general relation between reflection coefficient (R) and each refractive index (n1 and n2) is shown in equation (2), wherein reflection coefficient (R) means the perpendicular reflection coefficient.

$$R \text{ (reflection coefficient)} = (n1-n2)^2/(n1+n2)^2 \quad (2)$$

(4) Supporting Substrate

The supporting substrate 4 or 41 shown in FIGS. 2a–2c are substrate to support the organic EL display device, and it is preferred that the supporting substrate 41 which transmits the light from the organic EL display device or the color modulating layer is transparent, i.e., the transmittance of the light at a visible wavelength region of 400–700 nm is 50% or more.

It is not necessary that the supporting substrate 4 in FIG. 2c is transparent, because it is not the side from which the light is taken out.

As the transparent medium, the above-mentioned substrate comprising a glass plate and a polymer material can be used.

Concerning the thickness of the plate, the thickness of 1 µm–5 mm can be usually used because too thick substrate would influence the transmittance of light.

(5) Organic EL Element

As the organic EL element according to the present invention, the organic EL element having at least a recombining region and a luminescent region as an organic layer is used. As this recombining region and luminescent region exist usually in the luminescent (emitting) layer, only luminescent region may be used as an organic layer according to the present invention. Nevertheless, if necessary, e.g. a positively charged hole-injecting layer, an electron-injecting layer, an organic semiconductor layer, an electric barrier layer, and an attachment-improving layer can also be used.

Next, typical examples of constitution for the organic EL element used in the present invention will be shown below, although the organic EL element used in the present invention is not limited to these.

a. Anode/Luminescent layer/Cathode b. Anode/Positively charged hole-injecting layer/Luminescent layer/Cathode c. Anode/Luminescent layer/Electron-injecting layer/Cathode d. Anode/Positively charged hole-injecting layer/Luminescent layer/Electron-injecting layer/Cathode e. Anode/Organic semiconductor layer/Luminescent layer/Cathode f. Anode/Organic semiconductor layer/Electric barrier layer/Luminescent layer/Cathode g. Anode/Positively charged hole-injecting layer/Luminescent layer/Attachment-improving layer/Cathode Among these, the constitution d is preferably used.

(5)-1. Anode

As an anode, an electrode material made of a metal, an alloy, and an electroconductive compound, and a mixture of two or more of these having a large work function (higher than 4 eV) is preferably used. As examples of such an electrode material, metals such as Au, and electroconductive transparent materials such as CuI, ITO, $SnO_2$, and ZnO can be cited.

The anode can be prepared by forming a thin coat of these electrode materials by the method such as the deposition method and the sputtering method.

In case the luminescence from the luminescent layer is taken out from the anode in this way, it is preferred that the transmittance to the luminescence of the anode is 10% or more. It is also preferred that the sheet resistance of the anode is lower than several hundreds $\Omega/\square$. Although the thickness of the anode depends on the material, usually the range of 10 nm–1 µm, preferably the range of 10–200 nm is used.

(5)-2. Luminescent Layer (Emitting layer)

The luminescent members for the organic EL element are mainly organic compounds. The following organic compounds are used, depending on the desired color tones.

First, in case a luminescence from UV to violet is to be obtained, the compound expressed by the formula (1) is used, wherein X is a group expressed by the formula (2), wherein n is 2, 3, 4, or 5; Y is a group expressed by the formula (3).

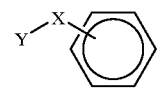

(1)

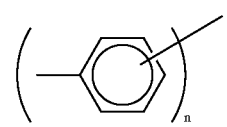

(2)

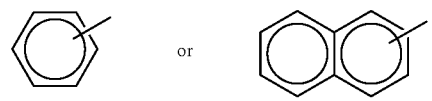

(3)

At least one hydrogen atom of phenyl group, phenylene group, or naphthyl group of the above-mentioned compounds, can be substituted for group(s) selected from $C_1$–$C_4$ alkyl group, alkoxy group, hydroxyl group, sulfonyl group, carbonyl group, amino group, dimethylamino group, or diphenylamino group. These groups can be bound each other to form a saturated 5- or 6-membered ring. Para-substituted phenyl, phenylene, and naphthyl compounds are preferred on account of a combining property and to form a smooth deposition coat, e.g., the following compounds expressed by the chemical formulas (4)–(8). Especially, p-quaterphenyl derivatives and p-quinquephenyl derivatives are preferred.

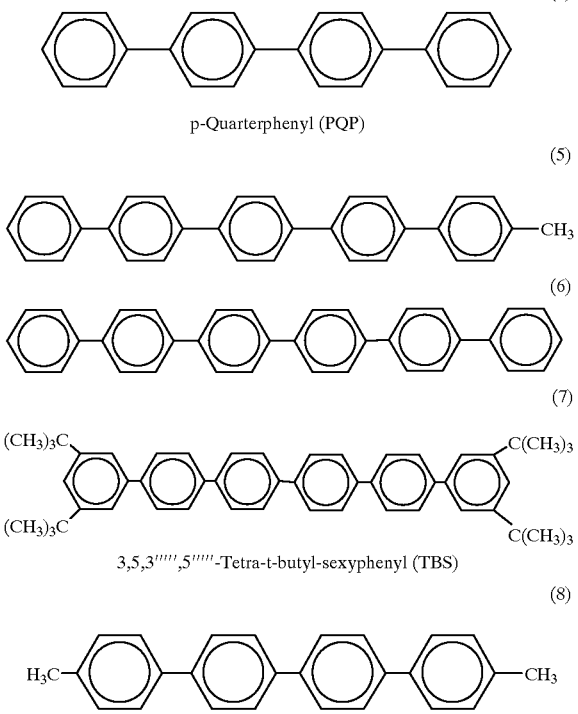

p-Quarterphenyl (PQP)

3,5,3''''',5'''''-Tetra-t-butyl-sexyphenyl (TBS)

Next, in order to obtain blue to green luminescence, optical whitening agents such as benzothiazol-based agents, benzoimidazol-based agents, and benzooxazol-based agents, metal-chelating oxinoid compounds, and stilbene-based compounds can be used.

Concrete compound names can be found e.g. in Japanese Patent Laid-open Publication No. Sho59-194393. Typical ones are optical whitening agents such as benzooxazol-based agents, benzothiazol-based agents, and benzoimidazol-based agents.

In addition, other useful compounds are listed in Chemistry of Synthetic Dyes 1971, pp. 628–637.

As the above-mentioned chelating oxinoid compounds, ones disclosed in Japanese Patent Laid-open Publication No. Sho63-295695 can be used. As the typical ones, 8-hydroxyquinolin-based metal complexes such as tris(8-quinolinol)aluminium (Alq) and dilithium epinetridione can be used.

As the above-mentioned stilbene-based compounds, ones disclosed in European Patent No. 0319881 and European Patent No. 073582 can be used.

Distyrylpyrazine derivatives disclosed in Japanese Patent Laid-open Publication No. Hei2-252793 can also be used as materials for the luminescent layer.

Polyphenyl-based compounds disclosed in European Patent 0387715 can also be used as materials for the luminescent layer.

In addition to the above-mentioned optical whitening agents, metal-chelating oxinoid compounds, and stilbene-based compounds, 12-phthaloperinone (J. Appl. Phys., Vol.27, L713 (1988)), 1,4-diphenyl-1,3-butadiene, 1,1,4,4-tetraphenyl-1,3-butadiene (both Appl. Phys. Lett., Vol.56, L799 (1990)), naphthalimide derivatives (Japanese Patent Laid-open Publication No. Hei2-305886), perylene derivatives (Japanese Patent Laid-open Publication No. Hei2-189890), oxadiazole derivatives (Japanese Patent Laid-open Publication No. Hei2-216791; Hamada et al., the 38th Combined Meeting of Applied Physics-Related Associations), aldazine-derivatives (Japanese Patent Laid-open Publication No. Hei2-220393), pyraziline (Japanese Patent Laid-open Publication No. Hei2-220394), cyclopentadiene derivatives (Japanese Patent Laid-open Publication No. Hei2-289675), pyrrolopyrrole derivatives (Japanese Patent Laid-open Publication No. Hei2-296891), styrylamine derivatives (Appl. Phys. Lett., Vol.56, L799 (1990)), coumarin-based compounds (Japanese Patent Laid-open Publication No. Hei2-191694), and polymers described e.g. in International Patent WO90/13148, and Appl. Phys. Lett., Vol. 58, 18, P1982 (1991) can also be used as the luminescent layer.

It is preferred to use aromatic dimethylidine compounds (disclosed in European Patent No.0388768 or Japanese Patent Laid-open Publication No. Hei3-231970), as the luminescence according to the present invention, such as 4,4'-bis(2,2-di-t-butylphenylvinyl)biphenyl (DTBPBBi), 4,4'-bis(2,2-diphenylvinyl)biphenyl (DPVBi), and derivatives thereof.

It is also preferred to use compounds expressed by the formula ($R_s$—Q)2-AL—O—L described e.g. in Japanese Patent Laid-open Publication No. Hei5-258862, wherein L is $C_6$–$C_{24}$ hydrocarbon containing a phenyl group, O—L is a phenolate legand, Q is a substituted 8-quinolinolate legand, $R_s$ is a substituted 8-quinolinolate ring-substituting group selected to spatially hinder two or more substituted 8-quinolinolate ligands to bind an aluminium atom, such as bis(2-methyl-8-quinolinolate)(p-phenylphenolate) aluminium(III) (PC-7) and bis(2-methyl-8-quinolinolate)(1-naphtholate) aluminium(III) (PC-17).

The method to obtain efficient blue-green mixed luminescence using doping according e.g. to Japanese Patent Laid-open Publication No. Hei6-9953 can also be used. In this case, the above-mentioned luminescent members as a host, a strong fluorescent pigment (dye) in a region from blue to green as a dopant such as coumarin-based dyes, and similar fluorescent pigment as ones used as the above-mentioned host can be used.

For example, luminescent members having a distyrylarylene moiety as a host, preferably DPVBi, diphenylaminovinylarylene as a dopant, preferably n,n-diphenylaminovinylbenzene (DPAVB) can be used.

As luminescent layers to obtain white luminescence, the followings can be used:

a) A luminescent layer that allows luminescence by providing energy levels of each layer of the organic EL overlaid structure and utilizing the tunnel injection (European Patent 0390551)

b) The same display device utilizing the tunnel injection as a), in which a white luminescent display device is exemplified (Japanese Patent Laid-open Publication No. Hei3-230584)

c) A two-layered luminescent layer (Japanese Patent Laid-open Publication No. Hei2-220390, Japanese Patent Laid-open Publication No. Hei2-216790)

d) A luminescent layer that is constructed with a plurality of materials each having a different luminescence wavelength (Japanese Patent Laid-open Publication No. Hei4-51491)

e) Luminescent layer in which a blue illuminant (fluorescent peak, 380–480 nm) and a green illuminant (fluorescent peak, 480–580 nm) are overlaid, and a red fluorescent pigment is contained (Japanese Patent Laid-open Publication No. Hei6-207170), and f) A luminescent layer in which a blue luminescent layer contains a blue fluorescent pigment, a green luminescent layer has a region containing a red fluorescent pigment, and contains a green fluorescent pigment (Japanese Patent Laid-open Publication No. Hei7-142169)

Among these, the constitution e) is preferably used. Followings (formulas 9–24) are red fluorescent pigment to obtain red luminescence:

(9)

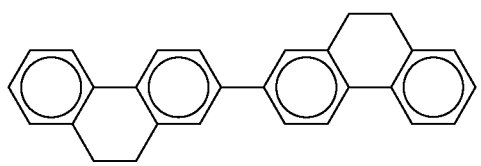

(10)

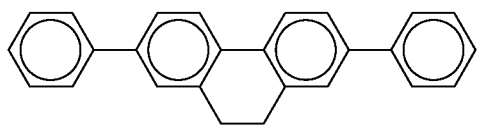

(11)

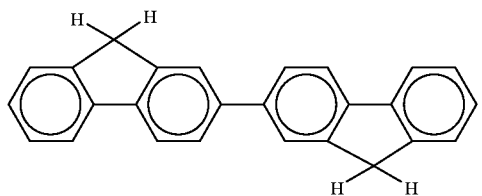

(12)

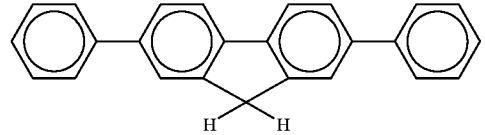

(13)

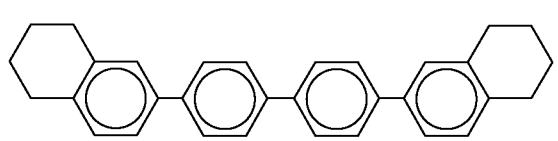

(14)

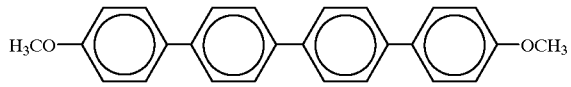

(15)

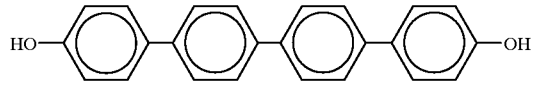

-continued (16)

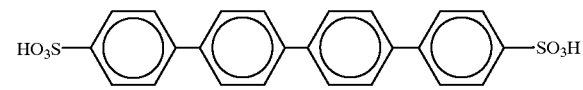

(17)

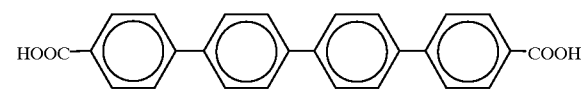

(18)

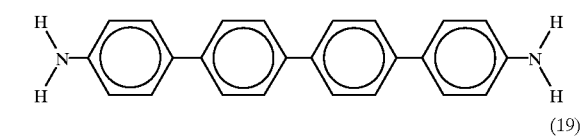

(19)

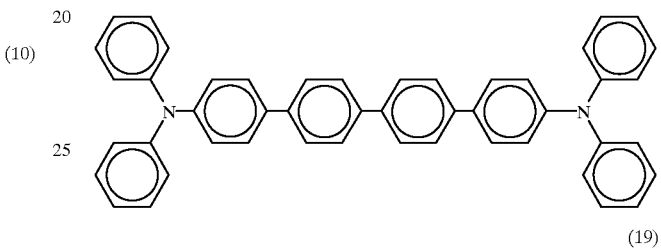

(19)

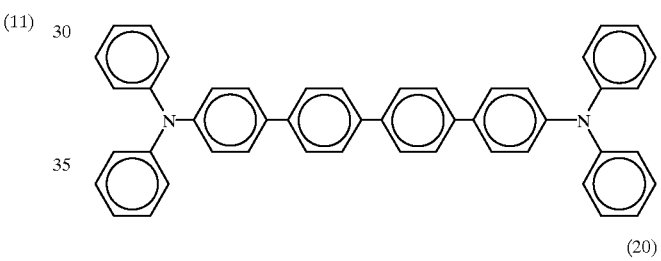

(20)

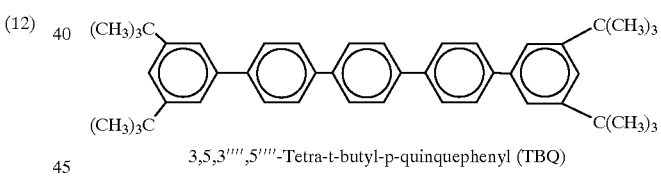

3,5,3'''',5''''-Tetra-t-butyl-p-quinquephenyl (TBQ)

(21)

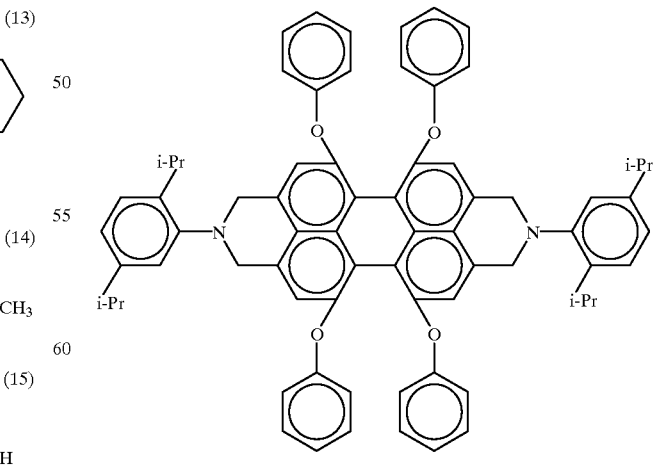

(Lumogen F Red)

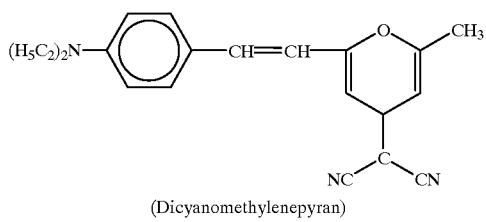

(Dicyanomethylenepyran) (22)

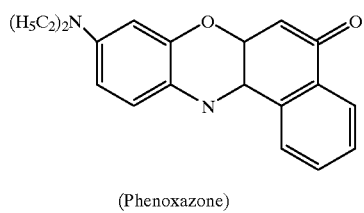

(Phenoxazone) (23)

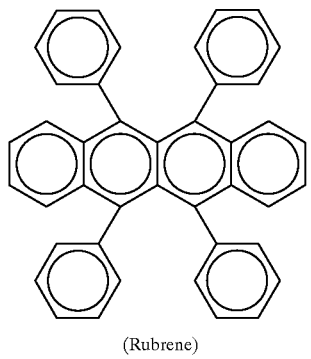

(Rubrene) (24)

As a method to form a luminescent layer using the above-mentioned materials, well-known methods such as the deposition method, the spin coat method, and the LB method is applicable. A "molecular piling-up coat" is most preferred for the luminescent layer.

The "molecular piling-up coat" is a thin coat formed by deposition from a gas-state material compound or a coat formed by solidification from a solution- or liquid-state material compound. The "molecular piling-up coat" is different from a thin coat (molecularly accumulated coat) formed by the LB method with respect to the aggregation structure, the higher structure, and the functions caused by these. In addition, as shown in Japanese Patent Laid-open Publication No. Sho57-51781, the luminescent layer can also be formed by dissolving a binder such as resin and a material compound in a solvent to make solution and by making a thin coat by the method such as the spin coat method.

It is usually preferred that the thickness of the luminescent layer is in a range of 5 nm–5 μm.

The luminescent layer of the organic EL element has the following functions as well:

a. Injecting function: a function that allows (1) to inject positively charged holes from the anode or the positively charged hole-injecting layer and (2) to inject electrons from the cathode or the electron-injecting layer, when the electric field is applied, b. Transporting function: a function to transport electric charges (electrons and positively charged holes) by the power of the electric field, c. Light-emitting function: a function that allows (1) to provide a site for re-coupling an electron and a positively charged hole and (2) to emit the light.

Although the easiness with which positively charged holes are injected and the easiness with which electrons are injected need not be equal, and the transportation abilities expressed by the mobility of positively charged holes and electrons need not be equal, it is preferred to transport one of the electric charges.

(5)-3. Positively Charged Hole-injecting Layer

Although a positively charged hole-injecting layer is not necessary for the display device according to the present invention, it is preferred to use the positively charged hole-injecting layer in order to improve the luminescence property.

This positively charged hole-injecting layer, which is a layer to help injection of positively charged holes into the luminescent layer, has a high mobility of positively charged holes, and has an ionization energy lower than 5.5 eV usually.

As a positively charged hole-injecting layer like this, a material that transports positively charged holes to a luminescence layer at lower electric field is preferred, and it is more preferred if the mobility of the positively charged hole is at least $1 \times 10^{-6}$ cm$^2$/V·s when the electric filed of $1 \times 10^4$–$1 \times 10^6$ V/cm is applied.

There is no limitation to the positively charged hole-injecting material like this as long as it has the above-mentioned good properties. It can be selected from (1) the materials usually used as a material to transport positively charged holes in photoconductive materials or (2) well-known materials used for positively charged hole-injecting layer of the EL display device, such as triazole derivatives (See U.S. Pat. No. 3,112,197), oxadiazole derivatives (See U.S. Pat. No. 3,189,447), imidazole derivatives (See Japanese Patent Publication No. Sho37-16096), polyarylalkane derivatives (See U.S. Pat. No. 3,615,402, U.S. Pat. No. 3,820,989, U.S. Pat. No. 3,542,544, Japanese Patent Publication No. Sho45-555, Japanese Patent Publication No. Sho51-10983, Japanese Patent Laid-open Publication No. Sho51-93224, Japanese Patent Laid-open Publication No. Sho55-17105, Japanese Patent Laid-open Publication No. Sho56-4148, Japanese Patent Laid-open Publication No. Sho55-108667, Japanese Patent Laid-open Publication No. Sho55-156953, Japanese Patent Laid-open Publication No. Sho56-36656), pyrazolin derivatives and pyrazolone derivatives (See U.S. Pat. No. 3,180,729, U.S. Pat. No. 4,278,746, Japanese Patent Laid-open Publication No. Sho55-88064, Japanese Patent Laid-open Publication No. Sho55-88065, Japanese Patent Laid-open Publication No. Sho49-105537, Japanese Patent Laid-open Publication No. Sho55-51086, Japanese Patent Laid-open Publication No. Sho56-80051, Japanese Patent Laid-open Publication No. Sho56-88141, Japanese Patent Laid-open Publication No. Sho57-45545, Japanese Patent Laid-open Publication No. Sho54-112637, Japanese Patent Laid-open Publication No. Sho55-74546), phenylenediamine derivatives (See U.S. Pat. No. 3,615,404, Japanese Patent Publication No. Sho51-10105, Japanese Patent Publication No. Sho46-3712, Japanese Patent Publication No. Sho47-25336, Japanese Patent Laid-open Publication No. Sho54-53435, Japanese Patent Laid-open Publication No. Sho54-110536, Japanese Patent Laid-open Publication No. Sho54-119925), arylamine derivatives (See U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961, U.S. Pat. No. 4,012,376, Japanese Patent Publication No. Sho49-35702, Japanese Patent Publication No. Sho39-27577, Japanese Patent Laid-open Publication No. Sho55-144250, Japanese Patent Laid-open Publication No. Sho56-119132, Japanese Patent Laid-open Publication No. Sho56-22437, DE Patent No. 1,110,518), amino-substituted calcone derivatives (See U.S. Pat. No. 3,526,501), oxazole derivatives (See U.S. Pat. No. 3,257,203), styrylanthracene derivatives (See Japanese Patent Laid-open Publication No. Sho56-46234), fluorenone derivatives (See Japanese Patent Laid-open Publication No. Sho54-110837), hydrazone derivatives (See U.S. Pat. No. 3,717,462, Japanese Patent Laid-open Publication No. Sho54-59143, Japanese Patent Laid-open Publication No. Sho55-52063, Japanese Patent Laid-open Publication No. Sho55-52064, Japanese Patent Laid-open Publication No. Sho55-46760, Japanese Patent Laid-open Publication No. Sho55-85495, Japanese Patent Laid-open Publication No. Sho57-11350, Japanese Patent Laid-open Publication No. Sho57-148749, Japanese Patent Laid-open Publication No. Hei2-311591), stilbene derivatives (See Japanese Patent Laid-open Publication No. Sho61-210363, Japanese Patent Laid-open Publication No. Sho61-228451, Japanese Patent Laid-open Publication No. Sho61-14642, Japanese Patent Laid-open Publication No. Sho61-72255, Japanese Patent Laid-open Publication No. Sho62-47646, Japanese Patent Laid-open Publication No. Sho62-36674, Japanese Patent Laid-open Publication No. Sho62-10652, Japanese Patent Laid-open Publication No. Sho62-30255, Japanese Patent Laid-open Publication No. Sho60-93445, Japanese Patent Laid-open Publication No. Sho60-94462, Japanese Patent Laid-open Publication No. Sho60-174749, Japanese Patent Laid-open Publication No. Sho60-175052), silazane derivatives (See U.S. Pat. No. 4,950,950), polysilane-based compounds (See Japanese Patent Laid-open Publication No. Hei2-204996), aniline-based copolymers (See Japanese Patent Laid-open Publication No. Hei2-282263), electroconductive oligomers (particularly thiophene oligomer) disclosed in Japanese Patent Laid-open Publication No. Hei1-211399, or the like.

Although the above-mentioned compounds can be used as the material for the positively charged hole-injecting layer, porphyrin compounds (disclosed e.g. in Japanese Patent Laid-open Publication No. Sho63-2956965), aromatic tertiary amine compounds and styryl amine compounds (See U.S. Pat. No. 4,127,412, Japanese Patent Laid-open Publication No. Sho53-27033, Japanese Patent Laid-open Publication No. Sho54-58445, Japanese Patent Laid-open Publication No. Sho54-149634, Japanese Patent Laid-open Publication No. Sho54-64299, Japanese Patent Laid-open Publication No. Sho55-79450, Japanese Patent Laid-open Publication No. Sho55-144250, Japanese Patent Laid-open Publication No. Sho56-119132, Japanese Patent Laid-open Publication No. Sho61-295558, Japanese Patent Laid-open Publication No. Sho61-98353, Japanese Patent Laid-open Publication No. Sho63-295695), aromatic tertiary amine compounds is more preferably used.

Compounds such as 4,4'-bis-[N-(1-naphthyl)-N-phenylamino]biphenyl (NPD) having two polycyclic aromatic rings in the molecule, which is described in U.S. Pat. No. 5,061,569, and 4,4',4"-tris[N-(3-methylphenyl)-N-phenylamino]triphenylamine (MTDATA) in which three triphenylamine units are linked all together in a star-burst shape, which is described in Japanese Patent Laid-open Publication No. Hei4-308688 can also be used.

In addition to the above-mentioned aromatic dimethylidene-based compounds shown as the material for the luminescent layer, inorganic compounds such as p-type Si and p-type SiC can also be used as the materials for the positively charged hole-injecting layer.

The positively charged hole-injecting layer can be formed by making a thin coat from the above-mentioned compounds by the well-known methods such as the vacuum deposition method, the spin coat method, the cast method, and the LB method. Although there is no special limitation to the thickness as the positively charged hole-injecting layer, the thickness is usually in a range of 5 nm–5 $\mu$m. The positively charged hole-injecting layer can be constructed with a layer composed of one or more kinds of the above-mentioned materials, or can be prepared by overlaying a positively charged hole-injecting layer that is composed of another kind of compound different from the above-mentioned positively charged hole-injecting layer.

In addition, an organic semiconductor layer, which is a layer helping injection of positively charged holes or electrons into the luminescent layer, having a electroconductivity which is higher than $1 \times 10^{-10}$ S/cm is preferred. As the materials for the organic semiconductor layer like this, electroconductive oligomers, such as thiophene-containing oligomers and aryl-containing oligomers, and electroconductive dendrimers, such as arylamine-containing dendrimers, can be used.

(5)-4. Electron-injecting Layer

On the other hand, an electron-injecting layer, which helps injection of electrons into the luminescent layer, has a large electron mobility. An attachment-improving layer is a layer that is composed of a material that attaches well especially to the cathode in the electron-injecting layer.

As the materials used for the electron-injecting layer, metal complexes of 8-hydroxyquinolin or their derivatives and oxadizol derivatives are preferably used. As the materials used for the attachment-improving layer, metal complexes of 8-hydroxyquinolin or their derivatives are preferably used.

As an example of the above-mentioned metal complexes of 8-hydroxyquinolin or their derivatives, metal-chelating oxinoid compounds including oxin (generally 8-quinolinol or 8-hydroxyquinolinone) can be cited.

As the oxadiazole derivatives, electron-transferring compounds expressed by general formulas 25–27 can be cited,

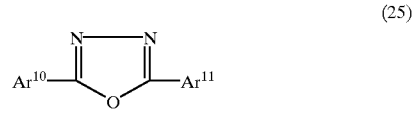

(25)

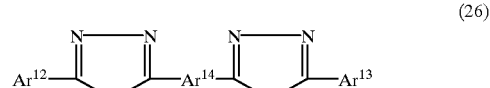

(26)

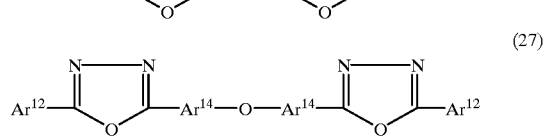

(27)

wherein $Ar^{10}$–$Ar^{13}$ are each substituted or unsubstituted ary group, $Ar^{10}$ and $Ar^{11}$ can be the same or different, $Ar^{12}$ and $Ar^{13}$ can be the same or different, $Ar^{14}$ is a substituted or unsubstituted arylene group, wherein said ary group can be phenyl group, biphenyl group, anthranyl group, perylenyl group, pyrenyl group, or the like, wherein said arylene group can be phenylene group, naphthylene group, biphenylene group, anthracenyl group, phenylenyl group, pyrenylene group, or the like, wherein substituting groups can be $C_1$–$C_{10}$ alkyl group, $C_1$–$C_{10}$ alkoxy group, cyano group, or the like, wherein said electron-transferring compound has preferably a thin coat-forming property.

As the above-mentioned electron-transferring compounds, the following compounds expressed by the chemical formulas (28)–(32) can be cited:

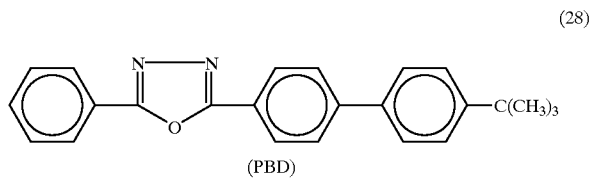

(28)

(PBD)

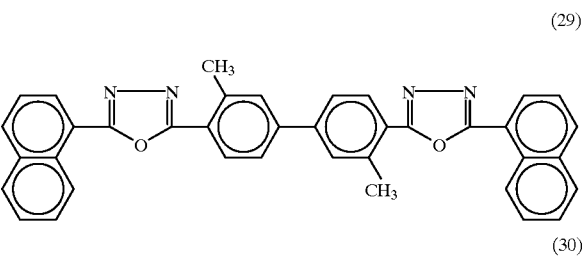

(29)

(30)

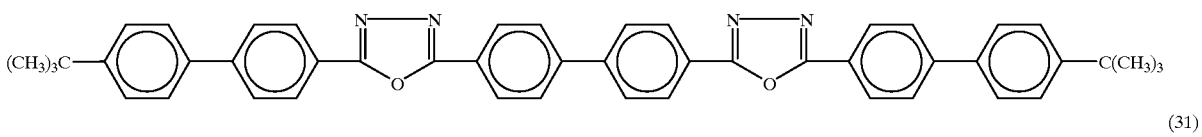

(31)

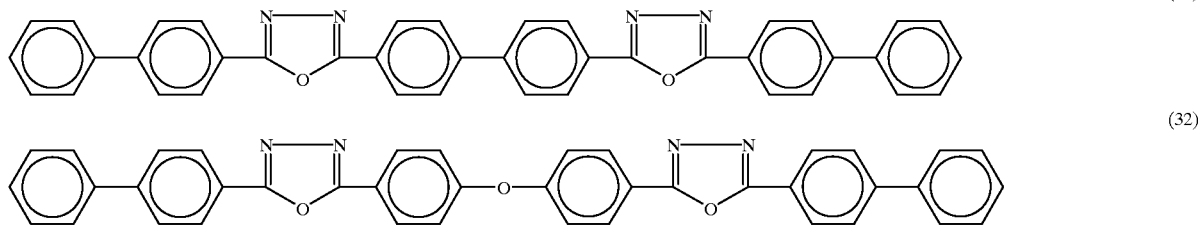

(32)

(5)-5. Cathode

As the cathode, metals, alloys, and electroconductive compounds having a small work function (smaller than 4 eV), and a mixture of two or more of these are used as an electrode material, such as sodium, sodium-potassium alloy, magnesium, lithium, magnesium-silver alloy, aluminium/aluminium oxide ($Al_2O_3$), aluminium-lithium alloy, indium, rare earth metals, and a mixture of two or more of these.

This cathode can be prepared by forming thin coats from these electron materials by the methods such as deposition and sputtering.

In addition, the sheet resistance as the cathode is preferably lower than several hundreds $\Omega/\square$, the thickness is normally in a range of 10 nm–1 $\mu$m, preferably in a range of 50–200 nm. In the EL display device used in the present invention, said anode and/or cathode are preferably transparent or translucent, because this makes the transmittance of the luminescence easy and enhances taking-out efficiency.

(5)-6. Preparation of Organic EL Element

An organic EL element can be prepared by forming the anode, the luminescent layer, the positively charged hole-injecting layer (if necessary), the electron-injecting layer (if necessary), and by forming the cathode, using the above-mentioned materials and methods. An organic EL element can also be prepared in a inverted. order to the above-mentioned order from a cathode to an anode.

Example of preparation of the organic EL element that was prepared on a supporting substrate serially in the order of anode/positively charged hole-injecting layer/luminescent layer/electron-injecting layer/cathode will be described below.

First, an anode is prepared on an appropriate substrate by forming a thin coat composed of an anode material, with the thickness being equal to or lower than 1 $\mu$m, preferably in the range of 10–200 nm, by the methods such as deposition and sputtering.

Second, a positively charged hole-injecting layer is formed on the anode. The formation of the positively charged hole-injecting layer can be carried out by the methods such as the vacuum deposition method, the spin coat method, the cast method, and the LB method as described above. Among them, the vacuum deposition method is preferred, because uniform coat can be easily obtained and pin halls are rarely generated.

In case the positively charged hole-injecting layer is formed by the vacuum deposition method, although the deposition condition depends on the compounds used (material of positively charged hole-injecting layer), and the crystal structure and re-coupling structure of the subjective positively charged hole-injecting layer, a deposition temperature of 50–450° C., a vacuum level of $1\times10^{-7}$–$1\times10^{-3}$ torr, a deposition rate of 0.01–50 nm/s, a substrate temperature of −50–300° C., and a thickness of 5 nm–5 $\mu$m are generally preferred.

Next, the luminescent layer, which is formed on the positively charged hole-injecting layer, can also be formed by making a thin coat from a desired organic luminescent member by the methods such as the vacuum deposition method, sputtering, the spin coat method, and the cast method.

Among them, the vacuum deposition method is most preferred, because a uniform coat can be easily formed, and pin holes are rarely generated. In case the luminescent layer is formed by the vacuum deposition method, although the deposition condition depends on the compounds used, the condition can be generally selected from the conditions similar to those for the positively charged hole-injecting layer.

Next, an electron-injecting layer is formed on the luminescent layer. It is preferred to form the electron-injecting layer by the vacuum deposition method, because it is necessary to form a uniform coat as well as the positively charged hole-injecting layer and the luminescent layer. The deposition condition can be selected from the conditions similar to those for the positively charged hole-injecting layer and the luminescent layer.

Finally, the organic EL element can be obtained by overlaying a cathode.

Although the cathode can be formed from a metal by the methods such as the deposition method and sputtering, the former is preferred in order to prevent the underlying organic layer from any possible damage during coat formation.

In the preparation of the organic EL element described above, it is preferred to prepare it from an anode to a cathode in one batch vacuum process.

In case a direct current voltage is applied to the organic EL element, if the polarity of the anode is "+", the that of the cathode is "−", and a voltage of 5–40 V is applied, a luminescence can be observed. In case the voltage is reversely applied, any current does not flow, and luminescence is not generated at all. In case alternating-current voltage is applied, uniform luminescence is observed only at a phase when the polarity of the anode is "+" and that of the cathode is "−". In this case, the shape of waves is arbitrary.

In order to prepare an organic EL element that luminescens being placed plane and discretely, the following methods can be used: (1) the X-Y dot matrix method in which a stripe-shaped anode and cathode are crossed, a direct current voltage is applied to each electrode, and the crossed part is luminescenced, and (2) the active matrix method that allows luminescence by forming an anode or a cathode to a dot-shaped one, and by applying a direct current voltage only to a specified dot part by a switching display device such as a thin film transistor (TFT). The stripe-shaped or dot-shaped anode and cathode can be formed (1) by etching or lifted off by the photolithography method or (2) by the methods such as masking deposition.

The present invention will be described more concretely by the examples below.

EXAMPLE 1

An organic EL display device shown in FIG. 2b that satisfies the relations d2>d1, T2=T1, and S2=S1, was prepared. On a glass substrate (Corning 7059, 100 mm×100 mm×1.1 mm thickness) as a supporting substrate, an acrylate-based light-hardening resist (viscosity, 250 cps), in which 3 wt. % (on a solid basis) carbon black was dispersed, was spin-coated, baked at 80° C., and set on an exposing machine having a light source of a mercury lamp.

Then the sample was exposed at 900 mJ/cm$^2$ at 365 nm through a mask by which a grating shading layer (FIG. 11), in which a stripe pattern of a line width of 50 μm (d2) and a gap of 250 μm and a stripe pattern of a line width of 100 μm and a gap of 600 μm orthogonalized, was obtained.

Next, development was carried out using a 1 wt. % aqueous solution of sodium carbonate for 2 min at room temperature. Then overall post-exposure was carried out from the glass surface side of the substrate at 3000 mJ/cm$^2$, and baked at 200° C. to form a pattern of the shading layer. A scanning electron microscopic (SEM) observation revealed that the cross-section is nearly rectangular. In addition, analysis using a spectrophotometer showed that the transmittance of this shading layer is equal to or lower than 10%, and the reflection coefficient is 5%, in a wavelength region of 400–700 nm.

Figure 12:
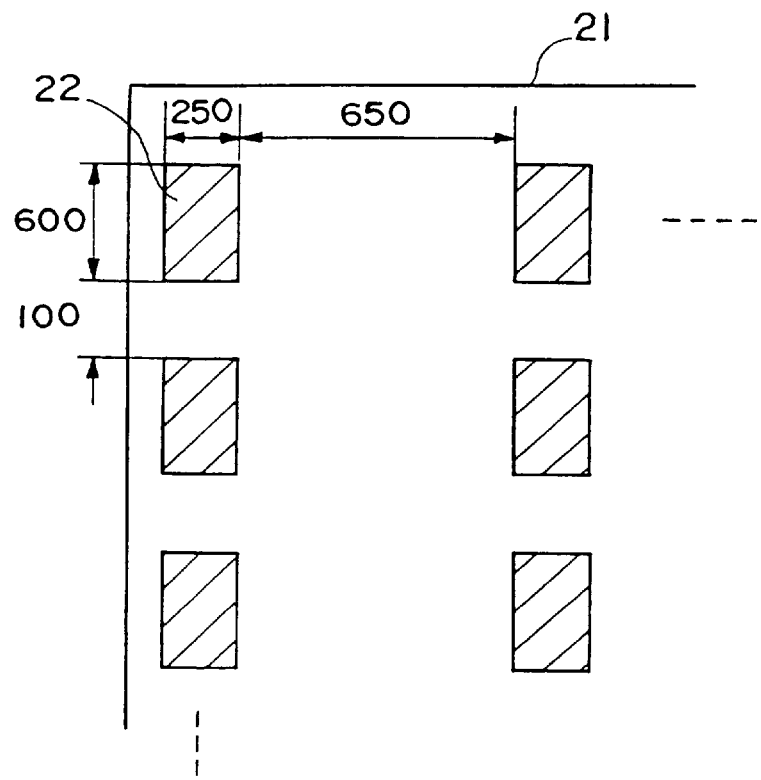
FIG. 12 is a diagram schematically showing a dot-pattern of the stripe arrangement according to the present invention.

Then the substrate was set on a screen printer, and a blue ink was printed in the intervals of the pattern of the shading layer using a plate by which a dot pattern (area S2, See FIG. 12) of a stripe arrangement of 250 μm×600 μm is obtained.

Said ink was prepared by mixing/dispersing 2.8 wt. % (on a solid basis) copper phthalocyanine-based pigment (C.I. Pigment Blue 15:6), 0.2 wt. % (on a solid basis) dioxazine-based pigment (C.I. Pigment Violet 23), 97 wt. % polyester resin PET9100 (Jujo Chem. Ind. Co.) as a binder resin, and cyclohexanone as a solvent.

Then the printed ink was baked at 160° C. to obtain a pattern of a blue color filter layer having a thickness of 20 μm. The reflective index of the color filter layer obtained was 1.50 at 589 nm.

Then the plate was transferred by 300 μm in parallel to a perpendicular direction from the stripe arrangement of the pattern of the blue color filter layer, the ink for the fluorescent layer A was printed in other intervals of the patterned shading layer.

Said ink was prepared by mixing/dispersing 0.03 mol/kg (on a solid base) Coumarin 6, polyester resin PET9100 as a binder resin, and cyclohexanone as a solvent.

Then the printed ink was baked at 160° C. to obtain the fluorescent layer A pattern having a thickness of 20 μm. The refractive index of the fluorescent layer A was 1.52 at 589 nm.

Then the plate was further transferred by 300 μm in parallel to a perpendicular direction from the stripe arrangement of the pattern of the fluorescent layer A, the ink for the fluorescent layer B was printed in other intervals of the patterned shading layer.

Said ink was prepared by mixing/dispersing (1) a fluorescent pigment (30 wt. % on a solid basis) that was prepared by admixing 0.03 mol/kg (on a solid base) Coumarin 6, 4 wt % (per fluorescent pigment) Rhodamine 6G, and 4 wt. % (per fluorescent pigment) Rhodamine B in a benzoguanamine resin, (2) a polyester resin PET9100 (70 wt. % on a solid basis) as a binder resin, and (3) cyclohexanone as a solvent.

Then the printed ink was baked at 160° C. to obtain a pattern of a fluorescent layer B having a thickness of 20 μm. The refractive index of the color filter layer obtained was 1.52 at 589 nm.

A substrate, on which a shading layer and three kinds of the color modulating layers are plane and discretely placed, was prepared in this way. It was constructed in such a way that the relation T1=T2 is satisfied, with T1 being the thickness of the shading layer, and T2 being the thickness of each of three kinds of color modulating layers.

A part of the shading layer and the color modulating layers was mechanically scraped in order to observe the luminescence brightness and chromaticity of the organic EL element to overlay later.

Then on this substrate, acrylate-based thermosetting type resin (Nippon Steel Chem. Co. V259PA) was spin-coated as a transparent medium, and baked at 80° C. The sample was further baked at 160° C., and polished/ground to the smoothness within ±0.1 μm if necessary. The refractive index of this transparent medium was 1.50 at 589 nm.

In addition, as a protective coat for the transparent medium, silicon oxide (SiO$_2$) was sputtered at a substrate temperature of 160° C. at 1×10$^{-6}$ torr. The thickness of the silicon oxide was 0.5 μm.

The overall thickness on the shading layer in the transparent medium prepared as described above was ca. 10 μm (corresponding to d1), and the relation d2>d1 was satisfied. The relation |n1−n2|<0.4 was also satisfied, judging from refractive indexes of the kinds of the resins used.

Then an organic EL element was prepared. First, a substrate was heated to 160° C., and a transparent electrode (anode), which is composed of ITO (indium-tin oxide) and has a thickness of 0.15 μm and surface resistance of 20 Ω/□, was prepared by sputtering on a silicon oxide coat at 1×10$^{-6}$ torr.

Figure 13:
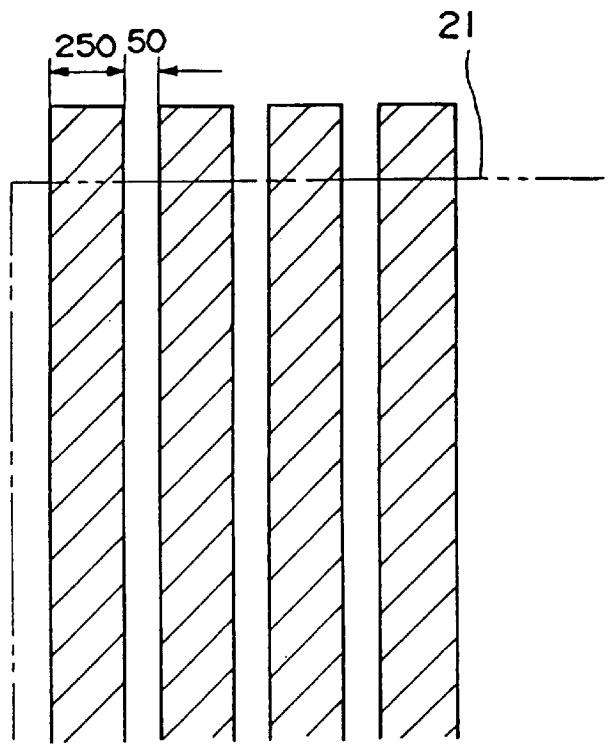
FIG. 13 is a diagram schematically showing the stripe-pattern of the anode according to the present invention.

Next a positive type photoresist (Fuji-Hunt Electronics Technology Co., HPR204) was spin-coated on ITO, and baked at 80° C. Then, after the position was adjusted to the shading layer pattern through a mask by which a stripe-shaped ITO pattern (line width, 250 μm: gap, 50 μm; See FIG. 13) was obtained, exposure was carried out at 100 mJ/cm$^2$ by an exposing machine.

Next the resist was developed with a 2.38% aqueous solution of tetramethylammonium hydroxide (TMAH), post-baked at 120° C., and a resist pattern was obtained.

Then the substrate was dipped into a 47 wt. % aqueous solution of hydrogen bromide at room temperature, ITO where the resist pattern are exposed, was etched to remove the resist, and a stripe-shaped ITO pattern (line width, 250 μm; gap, 50 μm) was formed.

Next this substrate, on which an ITO pattern was formed, was washed with isopropyl alcohol (IPA), UV-washed, and was fixed on a substrate holder of a depositing machine (ULVAC Japan Co.). MTDATA and NPD as positively charged hole-injecting materials, DPVBi as a luminescent member, DPAVB as a dopant, and Alq as an electron-injecting material were placed on a molybdenum resistance heating boat, Ag as a second metal of the cathode was put on a tungsten filament, and Mg as an electron-injecting material of the cathode was put on a molybdenum boat, each in order to use as depositing sources.

Then, the vacuum container was evacuated down to 5×10$^{-7}$ torr, overlaying was carried out in the following order. From the deposition of a positively charged hole-injecting layer to that of a cathode, the vacuum was continuously maintained.

First, MTDATA was deposited at a deposition rate of 0.1–0.3 nm/s up to a thickness of 200 nm as a positively charged hole-injecting layer. Then, NPD was deposited at a deposition rate of 0.1–0.3 nm/s up to a thickness of 20 nm as another positively charged hole-injecting layer.

In addition, as a luminescent layer, DPVBi was deposited at a deposition rate of 0.1–0.3 nm/s, and DPAVB was deposited at a deposition rate of 0.05 nm/s, up to an overall thickness of 40 nm (weight ratio of dopant per host material was 1.2–1.6).

In addition, as an electron-injecting layer, Alq was deposited at a deposition rate of 0.1–0.3 nm/s up to a thickness of 20 nm.

Figure 14:
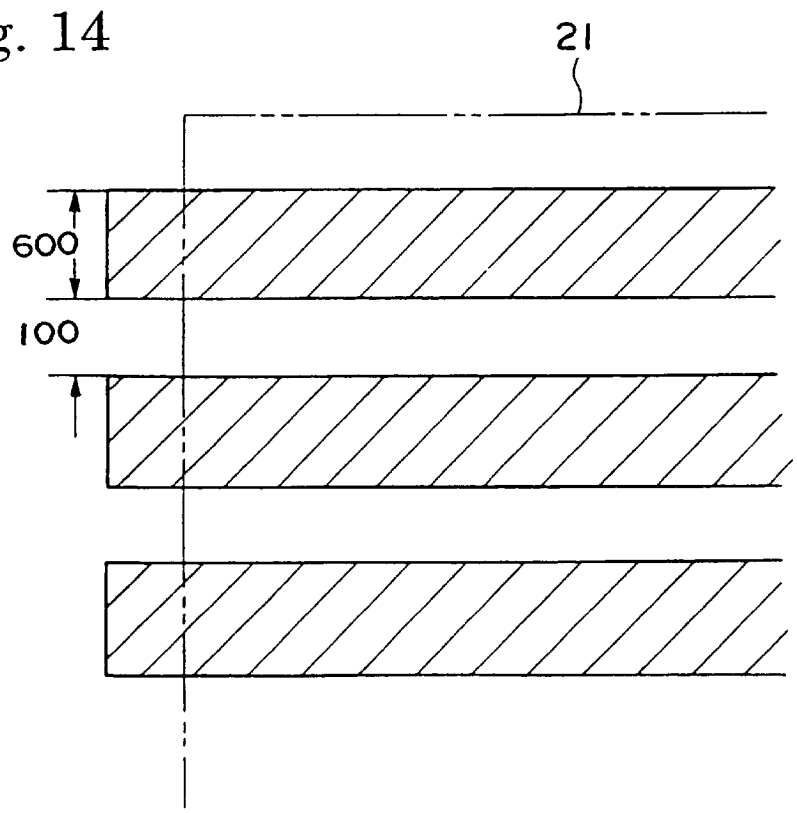
FIG. 14 is a diagram schematically showing the stripe-pattern of the cathode according to the present invention.
Figure 15:
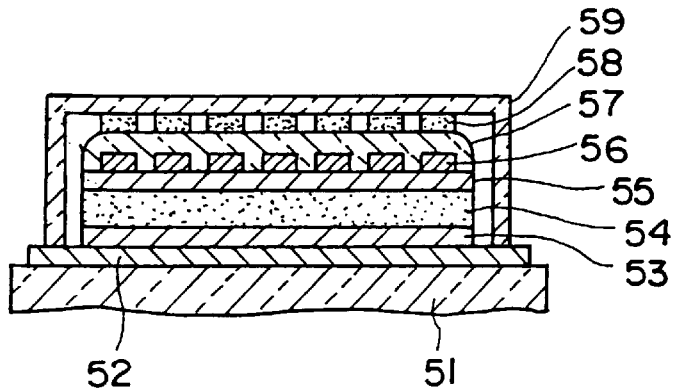
FIG. 15 is a sectional view showing the prior art, in which a transparent layer is provided between an EL element and a color filter.
Figure 16:
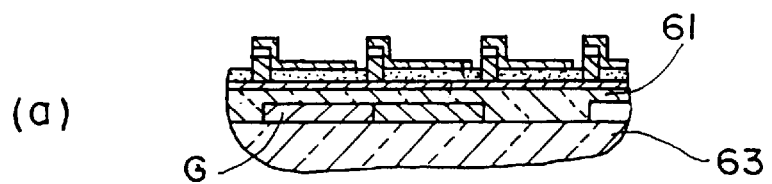
FIG. 16 is a sectional view showing the prior art, in which a luminescent medium is placed in order to receive luminescence of an organic EL element.
Figure 16:
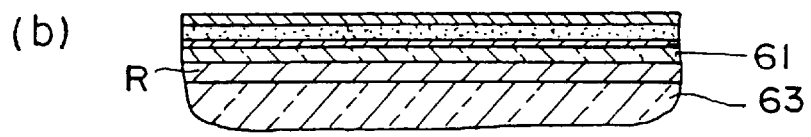
Figure 16:
Figure 17:
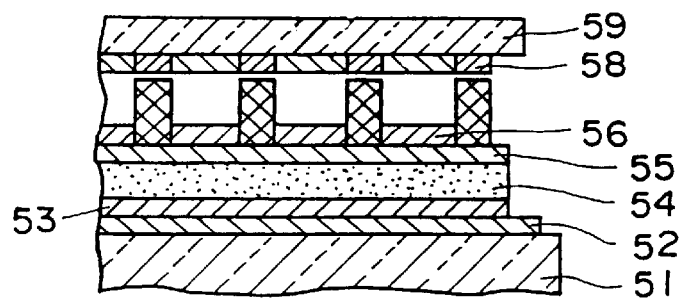
FIG. 17 is a sectional view showing the prior art, in which a spacer having a shading property is placed in gaps of pixels of the EL element.
Figure 18:
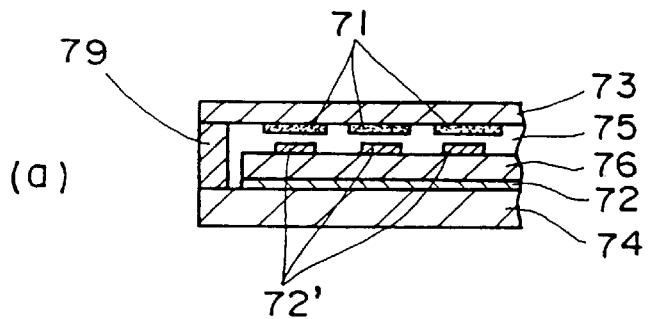
FIG. 18 is a sectional view showing the prior art, in which an EL element and color filters are placed oppositely.
Figure 18:
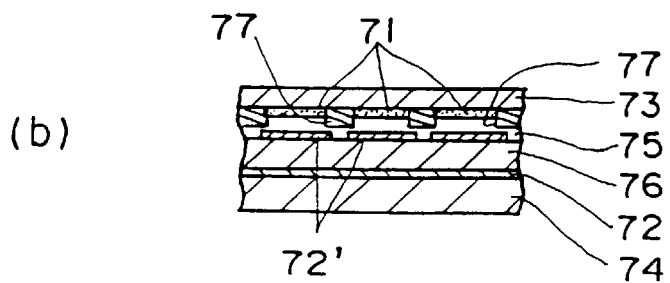

In addition, as a cathode, Mg and Ag were simultaneously deposited through a mask, which is perpendicular to the anode ITO stripe pattern, by which a stripe pattern (line width, 600 μm; gap, 100 μm; See FIG. 14) is formed, wherein Mg was deposited at a deposition rate of 1.3–1.4 nm/s, and Ag was deposited at a deposition rate of 0.1 nm/s up to a thickness of 200 nm.

When a direct current voltage of 8 V was applied between the anode and cathode in the organic EL element (FIGS. 2b, 3b) that was obtained in this way, a part (dot pattern S1 of 250 μm×600 μm), where the anode and the cathode crosses and the direct current voltage was applied, luminesced. The luminescence brightness of the organic EL element, which could be observed from the part where a shading layer and a modulating layer had been scraped, was 100 cd/m$^2$, and a blue color having the chromaticity of x=0.16, y=0.24 in CIE chromaticity coordinates (JIS Z 8701) was observed.

In addition, the luminescence brightness of the light observed from the blue color filter was 42 cd/m$^2$, and a blue color having a high color purity and chromaticity of x=0.14, y=0.12 was observed.

In addition, the luminescence brightness of the light observed from the fluorescent layer A was 120 cd/m$^2$, and a yellowish green color having the chromaticity of x=0.28, y=0.62 was observed.

In addition, the luminescence brightness of the light observed from the fluorescent layer B was 30 cd/m$^2$, and a red color having the chromaticity of x=0.60, y=0.31 was observed.

It was constructed in such a way that the area S1 of the luminescent region of the organic EL element is equal to the area S2 of the region of the color modulating layer (S1=S2).

By driving the organic EL display device obtained in this way, luminescence of a desired intrinsic color could be obtained from each color modulating layer. The viewing angle (See FIG. 4) that is defined as a range in which color-change (color-mixing) does not occur was ±80°, which is a wide range that does not cause any practical problem.

EXAMPLE 2

An organic EL display device, shown in FIG. 2b, which satisfies the relations d2>d1, T1 (20 μm)>T2 (15 μm), and S2=S1, was prepared. When the color modulating layer in Example 1, i.e., a blue color filter, fluorescent layer A, and fluorescent layer B were prepared, an EL element (FIG. 5d) was prepared under the same condition as Example 1 except that viscosity of each ink was reduced by increasing the amount of solvent, and each thickness was reduced to 15 μm.

By driving the organic EL display device obtained in this way, luminescence of the desired intrinsic color could be obtained from each color modulating layer. The viewing angle (See FIG. 4) that is defined as a range in which color-change (color-mixing) does not occur was ±80°, which is a wide range that does not cause any practical problem.

EXAMPLE 3

An organic EL display device, shown in FIG. 2b, which satisfies the relations d2>d1, T2=T1, and S2>S1, was prepared. An EL element (FIG. 6c) was prepared under the same condition as Example 1 except that the transparent electrode (anode) of the organic EL element was a stripe-shaped ITO pattern (line width, 200 μm; gap, 100 μm). In Example 3 also, the device was constructed in such a way that the relations d2>d1 and T2=T1 were satisfied.

Area S1 of the luminescence region of the organic EL element is 200 μm×600 μm (dot pattern), and area S2 of each color modulating layer is 250 μm×600 μm (dot pattern). Therefore, the relation S1<S2 is also satisfied.

By driving the organic EL display device obtained in this way, luminescence of a desired intrinsic color could be obtained from each color modulating layer. The viewing angle (See FIG. 4) that is defined as a range in which color-change (color-mixing) does not occur was ±85°, which is wider than Examples 1 and 2.

EXAMPLE 4

An organic EL display device, shown in FIG. 2a, which satisfied the relations d2=d1, T2=T1, and S2=S1, was prepared. As a supporting substrate, a glass substrate (barium borosilicate glass, 100 mm×100 mm×0.05 mm thick), on which a coat of a transparent electrode (anode) of ITO (indium tin oxide) having a thickness of 0.15 μm and a surface resistance of 20 Ω/□ was formed, was prepared by sputtering, wherein the refractive index of the glass substrate was 1.52 at 589 nm, and was used as a transparent medium.

Next, a substrate, on which a shading layer and a color modulating layer are placed plane discretely on the opposite side of the ITO coat surface under the same condition as Example 1, was prepared.

In addition, ITO was patterned under the same condition as Example 1, wherein the thickness on the shading layer of the transparent medium was 50μm (d1), and the relations d2=d1 and |n1−n2|<0.4 were satisfied.

The organic EL display device was prepared under the same condition as Example 1 (See FIGS. 2a and 3b), wherein it is constructed in such a way that the area S1 of the luminescence region of the organic EL element is equal to the area S2 of the region of the color modulating layer, i.e., S1=S2.

In this organic EL display device obtained, luminescence of the desired intrinsic color could be obtained from each color modulating layer. The viewing angle in which color-change (color-mixing) does not occur was ±45°, which was a level that does not cause any practical problem.

EXAMPLE 5

An organic EL display device, shown in FIG. 2c, which satisfies the relations d2>d1, T2=T1, and S2=S1, was prepared. On a glass substrate (Corning 7059, 100 mm×100 mm×1.1 mm thick) as a supporting substrate, acrylate-based light-hardening resist V259PA (Nippon Steel Chem. Co.), in which 30 wt. % (on a solid basis) carbon black was dispersed, was spin-coated, and baked at 80° C. Then the sample was further baked at 200° C. to form a black coat with a thickness of 2 μm.

Then the opposite side of the black coat was washed with IPA, UV-washed, and fixed in a substrate holder of a depositing machine (ULVAC Japan Co.). MTDATA and NPD as positively charged hole-injecting materials, DPVBi as a luminescent member, DPAVB as a dopant, and Alq as an electron-injecting material were placed on a molybdenum resistance heating boat, Ag was put on a tungsten filament as a second metal of the cathode, and Mg was put on a molybdenum boat as an electron-injecting metal of the cathode, in order to use both as depositing sources.

Then, the vacuum container was evacuated down to $5 \times 10^{-7}$ torr, a coat having a pattern of a cathode was formed through a mask by which a stripe pattern of 600 μm line width and 100 μm gap was made, then a coat from an electron-injecting layer to a positively charged hole-injecting layer was formed. When serially overlaying positively charged hole-injecting layers was carried out from a cathode, the vacuum was continuously maintained.

As a cathode, Mg and Ag were simultaneously deposited. Mg was deposited at a deposition rate of 1.3–1.4 nm/s, and Ag was deposited at a deposition rate of 0.1 nm/s, up to the overall thickness of 200 nm.

Next, as an electron-injecting layer, Alq was deposited at a deposition rate of 0.1–0.3 nm/s up to a thickness of 20 nm.

In addition, as a luminescent layer, DPVBi was deposited at a deposition rate of 0.1–0.3 nm/s, and DPAVB was deposited at a deposition rate of 0.05 nm/s, up to an overall thickness of 40 nm (weight ratio of dopant per host material is 1.2–1.6).

In addition, as a positively charged hole-injecting layer, NPD was deposited at a deposition rate of 0.1–0.3 nm/s, up to an overall thickness of 20 nm. As another positively charged hole-injecting layer, MTDATA was deposited at a deposition rate of 0.1–0.3 nm/s, up to an overall thickness of 40 nm.

Then, this substrate was transferred to a sputtering machine, an organic EL element was prepared by forming a coat with ITO as a transparent electrode (anode) of a resistance of 20 Ω/□ at room temperature through a mask by which a stripe pattern of a line width of 250 μm and a gap of 50 μm (See FIG. 13) is obtained, wherein the mask was placed in such a way that a cathode and an anode crosses perpendicularly and terminals of each electrode could be taken out.

Then epoxy-based light-hardening adhesive 3113 (Three Bond Co.) was applied to the vicinities of the cathode-anode crossing region using a dispenser in a width of ca. 1 mm keeping a space partly.

On the other hand, the substrates prepared under the same condition as Example 1, in which a shading layer and different color modulating layers were placed in the plane and discrete manners, were attached each other so that an organic EL element, a shading layer, and a color modulating layer are placed oppositely, the adhesive was hardened by radiating UV light only to the part where the adhesive was applied.

Then, under the atmosphere of nitrogen, a fluorinated hydrocarbon (3M Co., USA, FC-70), as a transparent medium, was injected through a gap of the adhesive by using a syringe.

Next, said adhesive was further filled into the gap of the adhesive, and hardened by UV light as described above. The refractive index of the fluorinated hydrocarbon was 1.30 at 589 nm. The distance (gap) between the organic EL element and the shading layer was 10 μm (d1), and the relations d2>d1 and |n1−n2|<0.4, were satisfied.

After the organic EL element was prepared in this way (See FIGS. 2c, 3b), when a direct current voltage of 8 V was applied between the anode and the cathode, the part (dot pattern of 250 μm×600 μm, S1),where the anode and the cathode crosses, luminesced. In addition, the luminescence brightness of the organic EL element observed from the part, where the shading layer and the modulating layer had been scraped, was 100 cd/m², and blue luminescence having a chromaticity in CIE chromaticity coordinates (JIS Z 8701) of x=0.16 and y=0.24 was obtained.

The luminescence brightness of the light observed from a blue color filter was 40 cd/m², and blue luminescence having a chromaticity of x=0.14 and y=0.12 was obtained.

In addition, the luminescence brightness of the light observed from a fluorescent layer A was 110 cd/m², and yellowish green luminescence having a chromaticity of x=0.28 and y=0.62 was obtained.

In addition, the luminescence brightness of the light observed from a fluorescent layer B was 28 cd/m², and red luminescence having a chromaticity of x=0.60 and y=0.31 was obtained.

The area S1 of the luminescence region of the organic EL element was equal to he area S2 of the region of the color modulating layer, satisfying the relation S1=S2.

By preparing the organic EL display device as described above, and driving it, luminescence of an intrinsic color could be obtained from each color modulating layer. The viewing angle (See FIG. 4) that is defined as a range in which color-change (color-mixing) does not occur was ±80°, which is a level that does not cause any practical problem.

EXAMPLE 6

An organic EL display device, shown in FIG. 2b, which satisfied the relations d2>d1, T2=T1, and S2=S1, and all the color modulating layer was a color filter, was prepared. On a glass substrate (Corning 7059, 100 mm×100 mm×1.1 mm thick) as a supporting substrate, acrylate-based light-hardening resist V259PA (Nippon Steel Chem. Co.) in which 30 wt. % (on a solid basis) carbon black was dispersed was spin-coated, and baked at 80° C. Then the resist coat was exposed to the light at 300 mJ/cm$^2$ at 365 nm by an exposing machine having a mercury lamp as a light source through a mask so that a pattern of the shading layer shown in FIG. 11 was obtained.

Then development was carried out using a 1 wt. % aqueous solution of sodium carbonate for 2 min at room temperature. The substrate was baked at 200° C. to form a pattern of the shading layer. A scanning electron microscopic (SEM) observation revealed that the cross-section is nearly rectangular.

In addition, analysis using a spectrophotometer showed that the transmittance of this shading layer is lower than 10%, and the reflection coefficient is 5%, at a wavelength of 400–700 nm.

Next, acrylate-based heat-hardening resin V259PA (Nippon Steel Chem. Co., equivalent to 70 wt. % on a solid basis), in which 28 wt. % (on a solid basis) copper phthalocyanine-based pigment (C.I. Pigment Blue 15:6) and 2 wt. % (on a solid basis) dioxazine-based pigment (C.I. Pigment Violet 23) were dispersed, was spin-coated, and baked at 80° C. Then the position was adjusted to the shading layer pattern through a mask so that the pattern (S2) of the shading layer shown in FIG. 12 was obtained. Then the resist coat was exposed to the light at 300 mJ/cm$^2$ at 365 nm by an exposing machine having a mercury lamp as a light source.

Then development was carried out using a 1 wt. % aqueous solution of sodium carbonate for 2 min at room temperature. Then the sample was baked at 200° C. to form a pattern of the blue color filter. The thickness of the blue color filter obtained was 2 µm, and its refractive index was 1.50 at 589 nm.

Next, acrylate-based heat-hardening resin V259PA (Nippon Steel Chem. Co., equivalent to 70 wt. % on a solid basis), in which 23 wt. % (on a solid basis) halogenated copper phthalocyanine-based pigment (C.I. Pigment Green 36) and 7 wt. % (on a solid basis) azo-based pigment (C.I. Pigment Yellow 83) were dispersed, was spin-coated, and baked at 80° C. Then the position was changed by 300 µm parallel to the direction perpendicular to the stripe arrangement of the blue color filter through a mask so that the pattern of the color modulating layer shown in FIG. 12 could be obtained. Then the resist coat was exposed to the light at 300 mJ/cm$^2$ at 365 nm by an exposing machine having a mercury lamp as a light source.

Then development was carried out using a 1 wt. % aqueous solution of sodium carbonate for 2 min at room temperature. Then the sample was baked at 200° C. to form a pattern of the green color filter. The thickness of the green color filter obtained was 2 µm, and its refractive index was 1.50 at 589 nm.

Next, acrylate-based heat-hardening resin V259PA (Nippon Steel Chem. Co., equivalent to 70 wt. % on a solid basis), in which 24 wt. % (on a solid basis) anthraquinone-based pigment (C.I. Pigment Red 177) and 6 wt. % (on a solid basis) azo-based pigment (C.I. Pigment Yellow 6) were dispersed, was spin-coated, and baked at 80° C. Then the position was changed by 300 µm parallel to the direction perpendicular to the stripe arrangement of the green color filter through a mask so that the pattern of the color modulating layer shown in FIG. 12 could be obtained. Then the resist coat was exposed to the light at 300 mJ/cm$^2$ at 365 nm by an exposing machine having a mercury lamp as a light source.

Then development was carried out using a 1 wt. % aqueous solution of sodium carbonate for 2 min at room temperature. Then the sample was baked at 200° C. to form a pattern of the red color filter. The thickness of the red color filter obtained was 2 µm, and its refractive index was 1.50 at 589 nm.

A substrate, in which a shading layer and color modulating layer (color filter) were plane and discretely placed and the relation T1=T2 was satisfied, was prepared as described above, wherein a very little part of the color modulating layer was mechanically scraped for convenience sake in order to observe the luminescence brightness and chromaticity of the organic EL element to overlay later.

In addition, the transparent electrode (ITO pattern, See FIG. 13), which is an anode in the transparent medium and organic EL element, was formed under the same condition as Example 1 so that the relation d2>d1 was satisfied.

Then the substrate was washed with IPA, UV-washed, and fixed in a substrate holder of a depositing machine (ULVAC Japan Co.). MTDATA and NPD as positively charged hole-injecting materials, DPVBi and PAVBi as a luminescence material, Rubrene, and Alq as an electron-injecting material were placed on a molybdenum resistance heating boat, Ag as a second metal of the cathode was put on a tungsten filament, and Mg as an electron-injecting metal of the cathode was put on a molybdenum boat, in order to use both as deposition sources.

Then, after the vacuum container was evacuated down to 5×10$^{-7}$ torr, coats were serially formed in the following order. When overlaying was carried out from a cathode to a positively charged hole-injecting layer, the vacuum was continuously maintained. A pattern (FIG. 14) of a cathode was formed through a mask by which a coat could be formed to be a perpendicularly crossing stripe pattern of 600 µm line width and 100 µm gap.

First, as a positively charged hole-injecting layer, MTDATA was deposited at a deposition rate of 0.1–0.3 nm/s, up to a thickness of 200 nm, and NPD was deposited at a deposition rate of 0.1–0.3 nm/s, up to a thickness of 20 nm.

Then, as a luminescent layer, DPVBi was deposited at a deposition rate of 0.1–0.3 nm/s, up to a thickness of 50 nm, and at the same time PAVBi was deposited at a deposition rate of 0.003–0.009 nm/s to be contained in DPVBi.

Next, as an electron-injecting layer, Alq was deposited at a deposition rate of 0.1–0.3 nm/s up to a thickness of 20 nm, in which Rubrene was contained by simultaneously depositing at a deposition rate of 0.0005–0.0015 nm/s as a second luminescent layer.

Finally, as a cathode, Mg and Ag were simultaneously deposited. Mg was deposited at a deposition rate of 1.3–1.4 nm/s, and Ag was deposited at a deposition rate of 0.1 nm/s, up to the overall thickness of 200 nm.

When a direct current voltage of 9 V was applied between the anode and the cathode of the organic EL element (See FIGS. 2b, 3b) that was obtained in this way, a part (dot pattern S1 of 250 m×600 µm), where the anode and the cathode crosses, luminesced. The luminescence brightness of the organic EL element, which could be observed from the part where a shading layer and a modulating layer had been scraped, was 100 cd/m$^2$, and a white color having the chromaticity of x=0.25, y=0.28 in CIE chromaticity coordinates (JIS Z 8701) was observed.

In addition, the luminescence brightness of the light observed from the blue color filter was 10 cd/m$^2$, and a blue color having the chromaticity of x=0.10, y=0.15 was observed.

In addition, the luminescence brightness of the light observed from the green color filter was 45 cd/m$^2$, and a yellowish green color having the chromaticity of x=0.28, y=0.62 was observed.

In addition, the luminescence brightness of the light observed from the red color filter was 15 cd/m$^2$, and a red color having the chromaticity of x=0.60, y=0.31 was observed.

The area S1 of the luminescence region of the organic EL element was equal to he area S2 of the region of the color modulating layer, satisfying the relation S1=S2.

By preparing the organic EL display device as described above, and driving it, luminescence of an intrinsic color could be obtained from each color modulating layer. The viewing angle (See FIG. 4) that is defined as a range in which color-change (color-mixing) does not occur was ±80°, which is a level that does not cause any practical problem.

EXAMPLES 7–10

In Examples 7–10, organic EL display devices were prepared under the same condition as Example 1 except that the relation between d2 and d1, the relation between T1and T2, and that the relation between S1 and S2 were changed within a range specific to the present invention. In Example 7, an organic EL display device, which satisfies the relations d2>d1, T2<T1, and S2>S1, was prepared. In Example 8, an organic EL display device, which satisfies the relations d2=d1, T2<T1, and S2>S1, was prepared. In Example 9, an organic EL display device, which satisfies the relations d2=d1, T2<T1, and S2=S1, was prepared. In Example 10, an organic EL display device, which satisfies the relations d2=d1, T2=T1, and S2>S1, was prepared. And viewing angles and color-mixing properties of the organic EL display devices prepared were determined. The results of Examples 7–10 as well as the results of Examples 1–6 are summarized in Table 5.

As shown in Table 5, mixing of colors from each color modulating layer did not occur in each organic EL display device prepared, and luminescence of an intrinsic color was obtained. The X and Y values in the CIE chromaticity coordinates with respect to luminescence from each color modulating layer were determined, resulting that shift of said values was smaller than 0.02.

The absolute value of each viewing angle (See FIG. 4) that is defined as a range in which color-change (color-mixing) does not occur was equal to or more than 45°, which is a level that does not cause any practical problem. Among the organic EL display devices tested, that of Examples 3 and 7, which satisfy the relations d2>d1, T2<T1, and S2>S1, and gave a viewing angle of 85°, was most excellent.

EXAMPLE 11

An organic EL display device, shown in FIG. 2b, which satisfies the relations d2>d1, T2<T1, and S2=S1, and all the color modulating layer is of one kind, was prepared. On a glass substrate (Corning 7059, 100 mm×100 mm×1.1 mm thick) as a supporting substrate, acrylate-based light-hardening resist V259PA (Nippon Steel Chem. Co.) in which 3 wt. % (on a solid basis) carbon black was dispersed was spin-coated, and baked at 80° C. Then the resist coat was exposed to the light by an exposing machine having a mercury lamp as a light source.

Then the sample was exposed at 900 mJ/cm$^2$ at 365 nm through a mask by which a grating shading layer (See FIG. 11), in which a stripe pattern of a line width of 50 µm (d$_2$) and a gap of 250 µm and a stripe pattern of a line width of 100 µm and a gap of 250 µm orthogonalize, was obtained.

Then development was carried out using a 1 wt. % aqueous solution of sodium carbonate for 2 min at room temperature. Then overall exposure was carried out from the glass side at 300 mJ/cm$^2$, and baked at 200° C. to form a pattern of the shading layer.

The thickness of the shading layer obtained was 8.0 µm. A scanning electron microscopic (SEM) observation revealed that the cross-section is nearly rectangular. In addition, analysis using a spectrophotometer showed that the transmittance of this shading layer is equal to or lower than 10%, and the reflection coefficient is 5%, at a wavelength of 400–700 nm.

Then, a fluorescent pigment composition was prepared by admixing Coumarin 6, 4 wt. % rhodamine 6G (per benzoguanamine resin), and 4 wt. % Rhodamine B (per benzobguanamine resin) in a benzoguanamine resin. A resist material (color modulating layer-forming material) was prepared by mixing the fluorescent pigment composition obtained and acrylate-based heat-hardening resin V259PA (Nippon Steel Chem. Co., equivalent to 70 wt. % on a solid basis).

The weight ratios were as follows: Coumarin 6, 0.03 mol per 1 kg of the sum of the fluorescent pigment, the benzoguanamine resin, and solid of the light-hardening resist; the fluorescent pigment, 30 wt. %; solid of the light-hardening resist, 70 wt. %.

Next, the resist material obtained was spin-coated on a patterned shading layer, and baked at 80° C. Then, the material was exposed to the light at 600 mJ/cm$^2$ from the

TABLE 5

| | $d_1$ (µm) | $d_2$ (µm) | The relation betw. $d_1$ and $d_2$ | $T_1$ (µm) | $T_2$ (µm) | The relation betw. $T_1$ and $T_2$ | $S_1$ (µm) | $S_2$ (µm) | The relation betw. $S_1$ and $S_2$ | Viewing angle (°) | Color mixing |
|---|---|---|---|---|---|---|---|---|---|---|---|
| Examp. 1 | 10 | 50 | $d_1 < d_2$ | 20 | 20 | $T_1 = T_2$ | 250 × 600 | 250 × 600 | $S_1 = S_2$ | ±80 | No |
| Examp. 2 | 10 | 50 | $d_1 < d_2$ | 20 | 15 | $T_1 > T_2$ | 250 × 600 | 250 × 600 | $S_1 = S_2$ | ±80 | No |
| Examp. 3 | 10 | 50 | $d_1 < d_2$ | 20 | 20 | $T_1 = T_2$ | 200 × 600 | 250 × 600 | $S_1 < S_2$ | ±85 | No |
| Examp. 4 | 50 | 50 | $d_1 = d_2$ | 20 | 20 | $T_1 = T_2$ | 250 × 600 | 250 × 600 | $S_1 = S_2$ | ±45 | No |
| Examp. 5 | 10 | 50 | $d_1 < d_2$ | 20 | 20 | $T_1 = T_2$ | 250 × 600 | 250 × 600 | $S_1 = S_2$ | ±80 | No |
| Examp. 6 | 10 | 50 | $d_1 < d_2$ | 2 | 2 | $T_1 = T_2$ | 250 × 600 | 250 × 600 | $S_1 = S_2$ | ±80 | No |
| Examp. 7 | 10 | 50 | $d_1 < d_2$ | 20 | 15 | $T_1 > T_2$ | 200 × 600 | 250 × 600 | $S_1 < S_2$ | ±85 | No |
| Examp. 8 | 50 | 50 | $d_1 = d_2$ | 20 | 15 | $T_1 > T_2$ | 200 × 600 | 250 × 600 | $S_1 < S_2$ | ±60 | No |
| Examp. 9 | 50 | 50 | $d_1 = d_2$ | 20 | 15 | $T_1 > T_2$ | 250 × 600 | 250 × 600 | $S_1 = S_2$ | ±45 | No |
| Examp. 10 | 50 | 50 | $d_1 = d_2$ | 20 | 20 | $T_1 = T_2$ | 200 × 600 | 250 × 600 | $S_1 < S_2$ | ±60 | No |
| Examp. 11 | 10 | 50 | $d_1 < d_2$ | 8 | 6.5 | $T_1 > T_2$ | 250 × 600 | 250 × 600 | $S_1 = S_2$ | — | No |
| Comp. Examp. 1 | 100 | 50 | $d_1 > d_2$ | 20 | 20 | $T_1 = T_2$ | 250 × 600 | 250 × 600 | $S_1 = S_2$ | ±30 | No |
| Comp. Examp. 2 | 70 | 50 | $d_1 > d_2$ | 10 | 20 | $T_1 < T_2$ | 250 × 600 | 250 × 600 | $S_1 = S_2$ | ±40 | Yes |
| Comp. Examp. 3 | 60 | 50 | $d_1 > d_2$ | 20 | 20 | $T_1 = T_2$ | 290 × 600 | 250 × 600 | $S_1 > S_2$ | ±30 | Yes |
| Comp. Examp. 9 | 110 | 50 | $d_1 > d_2$ | 8 | 6.5 | $T_1 > T_2$ | 250 × 600 | 250 × 600 | $S_1 = S_2$ | — | Yes/blot | side of the transparent substrate (glass plate), and an unexposed part of the color modulating layer was removed by developing with a 2.38 wt. % aqueous solution of tetramethylammonium hydroxide (TMAH).

Then the sample was baked at 200° C. to form a pattern (color modulating layer C) of a fluorescent layer. The thickness of color modulating layer C was 6.5 μm. The refractive index of the fluorescent layer A was 1.52 at 589 nm.

A substrate that was composed of a color modulating member that satisfies the relation T1>T2, in which a shading layer and color modulating layers were plane and discretely placed.

A vary small part of the shading layer and the color modulating layers was mechanically scraped in order to observe the luminescence brightness and chromaticity of the organic EL element to overlay later.

Then on this substrate, acrylate-based heat-hardening resin (Nippon Steel Chem. Co. V259PA) was spin-coated as a transparent medium, and baked at 80° C. The sample was further baked at 160° C. The refractive index of this transparent medium was 1.50 at 589 nm.

In addition, as a protective coat for the transparent medium, silicon oxide ($SiO_2$) was sputtered on the transparent medium obtained at a substrate temperature of 160° C. at $1\times10^{-6}$ torr. The thickness of the silicon oxide was 0.5 μm.

The overall thickness on the shading layer in the transparent medium prepared as described above was ca. 10 μm (corresponding to d1), and the relation d2>d1 was satisfied. The relation $|n1-n2|<0.4$ was also satisfied judging from refractive indexes of the kinds of the resins used.

Next, an organic EL element was prepared in a way similar to Example 1. Then, an organic EL element display as shown in FIGS. 2a and 3b was prepared using said organic EL element.

When a direct current voltage of 8 V was applied between the anode and the cathode of the organic EL display obtained, a part (dot pattern S1 of 250 m×600 μm), where the anode and the cathode crosses, luminesced. The luminescence brightness of the organic EL element, which could be observed from the part where a shading layer and a modulating layer had been scraped, was 100 cd/m², and luminescence of a blue color having the chromaticity of x=0.16, y=0.24 in CIE chromaticity coordinates (JIS Z 8701) was observed.

In addition, the luminescence brightness observed from color modulating layer C was 60 cd/m², and luminescence of a white color having the chromaticity of x=0.31, y=0.31 was observed.

By driving the organic EL display device obtained in this way, luminescence of white light could be obtained. Good display without blot or fuzziness was possible without loosing clearness.

EXAMPLES 12–15

The relation between the surface roughness |T1−T2| of the color modulating member and occurrence of cross talk was surveyed. First, four glass substrates (Corning 7059, 100 mm×100 mm×1.1 mm thickness) as supporting substrates were prepared. For each glass substrate, the color modulating member in Example 11 were spin-coated at various rotational speed. Thus, color modulating member whose surface roughness |T1−T2| was 0.2 μm (Example 12), 0.5 μm (Example 13), 1.0 μm (Example 14), and 2.0 μm (Example 15) were prepared under the same condition as Example 11.

Then, a transparent medium and an organic EL element were serially prepared on the color modulating member obtained in a way similar to Example 1 to prepare the organic EL display device according to the present invention.

Next, frequency of non-luminescing part (defect frequency) and frequency of cross talk were visually observed by driving the organic EL display device prepared in a way similar to Example 11.

The result is summarized in Table 7, resulting that in case the surface roughness value |T1−T2| is equal to or smaller than 2.0 μm, defect frequency and frequency of cross talk were rare (lower than 30% of overall display area).

EXAMPLE 16

An organic EL display device whose shading layer was inverted.-trapezoidal was prepared. On a glass substrate (Corning 7059, 100 mm×100 mm×1.1 mm thick) as a supporting substrate, acrylate-based light-hardening resist V259PA (Nippon Steel Chem. Co.) in which 3 wt. % (on a solid basis) carbon black was dispersed was spin-coated, and baked at 80° C. Then the resist coat was exposed to the light by an exposing machine having a mercury lamp as a light source.

Figure 11:
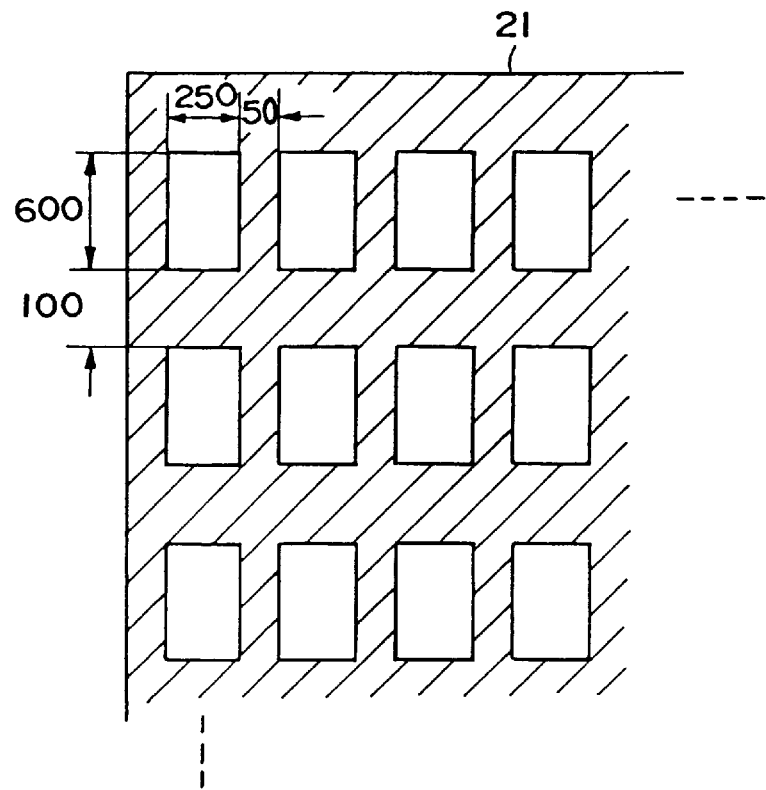
FIG. 11 is a diagram schematically showing the patterned shading layer according to the present invention.

Then the sample was exposed at 750 mJ/cm² at 365 nm through a mask by which a pattern of a grating shading layer shown in FIG. 11 was obtained.

Then development was carried out using a 1 wt. % aqueous solution of sodium carbonate for 3 min at room temperature. Then overall exposure was carried out from the glass side at 3000 mJ/cm², and baked at 200° C. to form a pattern of the shading layer.

The thickness of the shading layer obtained was 20 μm. A scanning electron microscopic (SEM) observation revealed that the cross-section is a inverted.-trapezoid having a line width of 30 μm (transparent medium side: 50 μm).

An organic EL display device shown in FIG. 9b was constructed by preparing a color modulating layer, a transparent medium, and an organic EL element under the same condition as Example 1.

Luminescence of an intrinsic color was obtained from each color modulating layer in this organic EL display device, and value of each viewing angle that is defined as a range in which color-change (color-mixing) does not occur was ±80°, which is a level that does not cause any practical problem. In addition, as the opening of the organic EL display device was enlarged, the overall brightness increased and a visual-check property was improved.

EXAMPLE 17

An organic EL display device in which a reflection part (Al) was placed on the side surface of a shading layer was prepared. A patterned shading layer was formed under the same condition as Example 1. A 10 wt. % aqueous solution of polyvinylalcohol was spin-coated all over the substrate, and the sample was baked at 80° C. SEM observation revealed that almost no polyvinylalcohol coat was attached to the side surface of the shading layer.

Then aluminum was deposited, with the substrate spinning, aiming at the side surface of the shading layer pattern, from an inclined direction to the substrate at a vacuum of $5\times10^{-7}$ torr at room temperature. SEM observation revealed that an aluminium coat was attached (overlaid) to the side surface of the shading layer. Spectroscopic analysis revealed that the reflection coefficient of the aluminium coat was equal to or higher than 10% at 400–700 nm.

An aluminium coat that attached to an unnecessary part was lifted off by washing with water together with a polyvinylalcohol coat.

A color modulating layer, a transparent medium, and an organic EL element were prepared under the same condition as Example 1 to construct the organic EL display device shown in FIG. 10b.

When a direct current voltage of 8 V was applied between the anode and the cathode of the organic EL display obtained, a part where the anode and the cathode crosses, luminesced. The luminescence brightness of the organic EL element, which could be observed from the part where a shading layer and a modulating layer had been scraped, was 100 cd/m$^2$, and luminescence of a blue color having the chromaticity of x=0.16, y=0.24 in CIE chromaticity coordinates (JIS Z 8701) was observed.

In addition, the luminescence brightness of the light observed from the blue color filter was 46 cd/m$^2$, and luminescence of a blue color having a high color purity and chromaticity of x=0.14, y=0.12 was obtained.

In addition, the luminescence brightness of the light observed from the fluorescent layer A was 130 cd/m$^2$, and luminescence of a yellowish green color having the chromaticity of x=0.28, y=0.62 was obtained.

In addition, the luminescence brightness of the light observed from the fluorescent layer B was 33 cd/m$^2$, and luminescence of a red color having the chromaticity of x=0.60, y=0.31 was obtained.

Brightness observed from color modulating layers was enhanced with the reflection coefficient on the side surface of the shading layer being higher than 10%. Luminescence of a desired intrinsic color from each color modulating layer was obtained, and value of each viewing angle that is defined as a range in which color-change (color-mixing) does not occur was ±80°, which is a level that does not cause any practical problem.

EXAMPLE 18

An organic EL display device whose shading layer was inverted.-trapezoidal and in which a reflection part (Al) was placed on the side surface of the shading layer was prepared. First, a patterned shading layer was formed under the same condition as Example 16. Then, a 10 wt. % aqueous solution of polyvinylalcohol was spin-coated all over the substrate, and baked at 80° C. SEM observation of the cross-section revealed that almost no polyvinylalcohol coat was attached to the reversely tapered side surface of the shading layer.

Then aluminium was deposited, with the substrate spinning, aiming at the reversely tapered side surface of the shading layer pattern, from an inclined direction to the substrate at a vacuum of 5×10$^{-7}$ torr at room temperature. SEM observation revealed that an aluminium coat was attached (overlaid) to the side surface of the shading layer. Spectroscopic analysis revealed that the reflection coefficient of the aluminium coat was equal to or higher than 10% at 400–700 nm.

An aluminium coat that attached to an unnecessary part was lifted off by washing with water together with a polyvinylalcohol coat.

A color modulating layer, a transparent medium, and an organic EL element were prepared under the same condition as Example 1 to construct the organic EL display device shown in FIG. 10c.

When a direct current voltage of 8 V was applied between the anode and the cathode of the organic EL display obtained, a part where the anode and the cathode crosses, luminesced. The luminescence brightness of the organic EL element, which could be observed from the part where a shading layer and a modulating layer had been scraped, was 100 cd/m$^2$, and luminescence of a blue color having the chromaticity of x=0.16, y=0.24 in CIE chromaticity coordinates (JIS Z 8701) was obtained.

In addition, the luminescence brightness of the light observed from the blue color filter was 50 cd/m$^2$, and luminescence of a pure blue color having the chromaticity of x=0.14, y=0.12 was obtained.

In addition, the luminescence brightness of the light observed from the fluorescent layer A was 140 cd/m$^2$, and luminescence of a yellowish green color having the chromaticity of x=0.28, y=0.62 was obtained.

In addition, the luminescence brightness observed from the fluorescent layer B was 36 cd/m$^2$, and luminescence of a red color having the chromaticity of x=0.60, y=0.31 was obtained.

Brightness observed from a color modulating layer was enhanced with the reflection coefficient on the side surface of the shading layer being equal to or higher than 10%. Luminescence of a desired intrinsic color from each color modulating layer was obtained, and value of each viewing angle that is defined as a range in which color-change (color-mixing) does not occur was ±80°, which is a level that does not cause any practical problem. In addition, as the opening of the organic EL display device was enlarged, the overall brightness increased and a visual-check property was improved.

EXAMPLE 19

An organic EL display device in which a reflection part (Al) was placed on the side surface of a shading layer was prepared. A patterned shading layer was formed under the same condition as Example 1 except that aluminium powder was used instead of carbon black.

The thickness of the shading layer obtained was 20 μm. Scanning electron microscopic (SEM) observation revealed that the cross-section is nearly rectangular. Spectroscopic analysis revealed that the transmittance of the shading layer is lower than 10%, and the reflection coefficient was equal to or higher than 10% at 400–700 nm.

A color modulating layer, a transparent medium, and an organic EL element were prepared under the same condition as Example 1 to construct the organic EL display device shown in FIG. 10b.

When a direct current voltage of 8 V was applied between the anode and the cathode of the organic EL display obtained, a part where the anode and the cathode crosses, luminesced. The luminescence brightness of the organic EL element, which could be observed from the part where a shading layer and a modulating layer had been scraped, was 100 cd/m$^2$, and luminescence of a blue color having the chromaticity of x=0.16, y=0.24 in CIE chromaticity coordinates (JIS Z 8701) was obtained.

In addition, the luminescence brightness of the light observed from the blue color filter was 45 cd/m$^2$, and luminescence of a blue color having a higher color purity and chromaticity of x=0.14, y=0.12 was obtained.

In addition, the luminescence brightness of the light observed from the fluorescent layer A was 125 cd/m$^2$, and luminescence of a yellowish green color having the chromaticity of x=0.28, y=0.62 was obtained.

In addition, the luminescence brightness the light observed from the fluorescent layer B was 32 cd/m$^2$, and luminescence of a red color having the chromaticity of x=0.60, y=0.31 was obtained.

Thus, brightness observed from color modulating layers was enhanced, with the reflection coefficient on the side surface of the shading layer being equal to or higher than 10%. Luminescence of a desired intrinsic color from each color modulating layer was obtained, and value of each viewing angle that is defined as a range in which color-change (color-mixing) does not occur was ±80°, which is a level that does not cause any practical problem.

EXAMPLE 20

An organic EL display device whose shading layer was inverted.-trapezoidal and in which a reflection part (Al) was placed on the side surface of a shading layer was prepared. First, a patterned shading layer was formed under the same condition as Example 16, except that aluminum powder was used instead of carbon black.

The thickness of the shading layer obtained was 20 µm. Scanning electron microscopic (SEM) observation revealed that the cross-section was a inverted.-trapezoid having a line width of 30 µm (transparent medium side: 50 µm). Spectroscopic analysis revealed that the transmittance of the shading layer is equal to or lower than 10%, and reflection coefficient was equal to or higher than 10%, at 400–700 nm.

A color modulating layer, a transparent medium, and an organic EL element were prepared under the same condition as Example 1 to construct the organic EL display device shown in FIG. 10c.

When a direct current voltage of 8 V was applied between the anode and the cathode of the organic EL display obtained, a part where the anode and the cathode crosses, luminesced. The luminescence brightness of the organic EL element, which could be observed from the part where a shading layer and a modulating layer had been scraped, was 100 cd/m$^2$, and luminescence of a blue color having the chromaticity of x=0.16, y=0.24 in CIE chromaticity coordinates (JIS Z 8701) was obtained.

In addition, the luminescence brightness of the light observed from the blue color filter was 49 cd/m$^2$, and luminescence of a blue color having a higher color purity and chromaticity of x=0.14, y=0.12 was obtained.

In addition, the luminescence brightness of the light observed from the fluorescent layer A was 135 cd/m$^2$, and luminescence of a yellowish green color having the chromaticity of x=0.28, y=0.62 was obtained.

In addition, the luminescence brightness of the light observed from the fluorescent layer B was 35 cd/m$^2$, and luminescence of a red color having the chromaticity of x=0.60, y=0.31 was obtained.

Thus, brightness observed from color modulating layers was enhanced, with the reflection coefficient on the side surface of the shading layer being equal to or higher than 10%. Luminescence of a desired intrinsic color from each color modulating layer was obtained, and value of each viewing angle that is defined as a range in which color-change (color-mixing) does not occur was ±80°, which is a level that does not cause any practical problem. In addition, as the opening of the organic EL display device was enlarged, the overall brightness increased and a visual-check property was improved.

EXAMPLE 21

An organic EL display device whose shading layer was inverted.-trapezoidal and in which a reflection part (TiO$_2$) was placed on the side surface of a shading layer was prepared. First, a patterned shading layer was formed under the same condition as Example 16, except that titanium oxide (TiO$_2$) powder was used instead of carbon black.

The thickness of the shading layer obtained was 20 µm. Scanning electron microscopic (SEM) observation revealed that the cross-section was a inverted.-trapezoid having a line width of 30 µm (transparent medium side: 50 µm). Spectroscopic analysis revealed that a transmittance of this shading layer was lower than 10%, and the reflection coefficient of the aluminium coat was equal to or higher than 10%, at 400–700 nm.

A color modulating layer, a transparent medium, and an organic EL element were prepared under the same condition as Example 1 to construct the organic EL display device shown in FIG. 10c.

When a direct current voltage of 8 V was applied between the anode and the cathode of the organic EL display obtained, a part where the anode and the cathode crosses, luminesced. The luminescence brightness of the organic EL element, which could be observed from the part where a shading layer and a modulating layer had been scraped, was 100 cd/m$^2$, and luminescence of a blue color having the chromaticity of x=0.16, y=0.24 in CIE chromaticity coordinates (JIS Z 8701) was obtained.

In addition, the luminescence brightness of the light observed from the blue color filter was 48 cd/m$^2$, and luminescence of a blue color having a higher color purity and chromaticity of x=0.14, y=0.12 was obtained.

In addition, the luminescence brightness of the light observed from the fluorescent layer A was 133 cd/m$^2$, and luminescence of a yellowish green color having the chromaticity of x=0.28, y=0.62 was obtained.

In addition, the luminescence brightness of the light observed from the fluorescent layer B was 35 cd/m$^2$, and luminescence of a red color having the chromaticity of x=0.60, y=0.31 was obtained.

Thus, brightness observed from color modulating layers was enhanced with the reflection coefficient on the side surface of the shading layer being equal to or higher than 10%. Luminescence of a desired intrinsic color from each color modulating layer was obtained, and value of each viewing angle that is defined as a range in which color-change (color-mixing) does not occur was ±80°, which is a level that does not cause any practical problem. In addition, as the opening of the organic EL display device was enlarged, the overall brightness increased and a visual-check property was improved.

COMPARATIVE EXAMPLES 1–3

An organic EL display device was constructed under the same condition as Example 1, except that the relation between d2 and d1, the relation between T1 and T2, and the relation between S1 and S2 were changed to those shown in Table 5. In Comparative Example 1, an organic EL display device having relations d2 (50 µm)<d1 (100 µm), T1=T2, and S1=S2 was constructed. In Comparative Example 2, an organic EL display device having relations d2 (50 µm)<d1 (70 µm), T1<T2, and S1=S2 was constructed.

In Comparative Example 3, an organic EL display device having relations d2 (50 µm)<d1 (60 µm), T1=T2, and S1>S2 was constructed.

An organic EL display device constructed as described in Comparative Example 1 is shown in FIGS. 2b and 3a.

An organic EL display device constructed as described in Comparative Example 2 is shown in FIGS. 2b and 5a.

An organic EL display device constructed as described in Comparative Example 3 is shown in FIGS. 2b and 7a.

The result of viewing angles measured with respect to each organic EL display device are summarized in Table 5. As one can easily understand the result, color-mixing was observed with respect to these organic EL display devices. Concerning X and Y values in CIE chromaticity coordinates, a difference higher than 0.02 was generated. Viewing angle that is defined as a range in which color-change (color-mixing) does not occur in these organic EL display devices were considerably narrow (±30° to ±40°).

COMPARATIVE EXAMPLE 4

An organic EL element device having a transmittance of a shading layer higher than 10% in Example 1 was constructed. On a glass substrate (Corning 7059, 100 mm×100 mm×1.1 mm thick) as a supporting substrate, acrylate-based light-hardening resist V259PA (Nippon Steel Chem. Co.) in which 1 wt. % (on a solid basis) carbon black was dispersed was spin-coated, and baked at 80° C. Then the resist coat was exposed to the light by an exposing machine having a mercury lamp as a light source.

Then the sample was exposed at 900 mJ/cm$^2$ at 365 nm through a mask by which a pattern of a grating shading layer shown in FIG. 11 was obtained.

Then development was carried out using a 1 wt. % aqueous solution of sodium carbonate for 2 min at room temperature. Then overall exposure was carried out from the glass side at 3000 mJ/cm$^2$, and baked at 200° C. to form a pattern of the shading layer.

The thickness of the shading layer obtained was 20 μm. Scanning electron microscopic (SEM) observation revealed that the cross-section was rectangular. Spectroscopic analysis revealed that a transmittance of this shading layer was lower than 10%, and the reflection coefficient was 5%, at 400–700 nm.

A color modulating layer, a transparent medium, and an organic EL element were prepared under the same condition as Example 1 to construct the organic EL display device.

When a direct current voltage of 8 V was applied between the anode and the cathode of the organic EL display obtained, a part where the anode and the cathode crosses, luminesced. The luminescence brightness of the organic EL element, which could be observed from the part where a shading layer and a modulating layer had been scraped, was 100 cd/m$^2$, and luminescence of a blue color having the chromaticity of x=0.16, y=0.24 in CIE chromaticity coordinates (JIS Z 8701) was obtained.

In addition, the luminescence brightness of the light observed from the blue color filter was 45 cd/m$^2$, and luminescence of a blue color having the chromaticity of x=0.20, y=0.21 was obtained.

In addition, the luminescence brightness of the light observed from the fluorescent layer A was 130 cd/m$^2$, and luminescence of a yellowish green color having the chromaticity of x=0.30, y=0.50 was obtained.

In addition, the luminescence brightness of the light observed from the fluorescent layer B was 36 cd/m$^2$, and luminescence of a pink color having the chromaticity of x=0.50, y=0.32 was obtained.

Thus, as transmittance of the shading layer exceed 10%, and a shading property of the organic EL display device or color modulating layers was not enough, the light from each color modulating layer was remarkably mixed. In addition, the chromaticity was shifted to white (x=0.32, y=0.31), and the color purity was remarkably lowered. Therefore, the preferred transmittance of a shading layer in the organic EL display device is 10% or lower.

COMPARATIVE EXAMPLE 5

The relation between (1) the absolute value of the difference of refractive index n1 of the transparent medium and refractive index n2 of the color modulating layer and (2) the luminescence brightness was surveyed. An organic EL display device was constructed under the same condition as Example 5, except that nitrogen was used as a transparent medium, wherein refractive index of nitrogen is 1.00 at 589 nm.

When a direct current voltage of 8 V was applied between the anode and the cathode of the organic EL display obtained, a part where the anode and the cathode crosses, luminesced. The luminescence brightness of the organic EL element, which could be observed from the part where a shading layer and a modulating layer had been scraped, was 100 cd/m$^2$, and luminescence of a blue color having the chromaticity of x=0.16, y=0.24 in CIE chromaticity coordinates (JIS Z 8701) was obtained.

In addition, the luminescence brightness of the light observed from the blue color filter was 34 cd/m$^2$, and luminescence of a blue color having the chromaticity of x=0.14, y=0.12 was obtained.

In addition, the luminescence brightness of the light observed from the fluorescent layer A was 100 cd/m$^2$, and luminescence of a yellowish green color having the chromaticity of x=0.28, y=0.62 was obtained.

In addition, the luminescence brightness of the light observed from the fluorescent layer B was 24 cd/m$^2$, and luminescence of a pink color having the chromaticity of x=0.60, y=0.31 was obtained.

Thus, as the absolute value of the difference of refractive index n1 of the transparent medium and refractive index n2 of the color modulating layer is higher than 0.4 (|n1−n2|>0.4), the reflection of luminescence of the organic EL display device at color modulating layer interfaces is large, and entrance of the light into color modulating layers tends to be lost. Therefore, luminescence brightness from color modulating layers in the organic EL display device as constructed in this way was lowered.

The relation between the absolute value of the difference of refractive index n1 of the transparent medium and refractive index n2 of the color modulating layer |n1−n2| and the luminescence brightness is summarized in Table 6 (Examples. 1, 4, 5, and Comparative Example 5).

TABLE 6

|  | | | | Luminescence brightness of color modulating layers (cd/m$^2$) | | |
| --- | --- | --- | --- | --- | --- | --- |
|  | n1 | n2 | \|n1−n2\| | Blue filter | Fluorescent layer A | Fluorescent layer B |
| Example 1 | 1.50 | 1.50 1.52 | 0–0.02 | 42 | 120 | 30 |
| Example 2 | 1.52 | 1.50 1.52 | 0–0.02 | 42 | 120 | 30 |
| Example 5 | 1.30 | 150 1.52 | 0.2–0.22 | 40 | 110 | 28 |

TABLE 6-continued

| | n1 | n2 | |n1–n2| | Blue filter | Fluorescent layer A | Fluorescent layer B |
|---|---|---|---|---|---|---|
| | | | | | Luminescence brightness of color modulating layers (cd/m$^2$) | | |
| Comparative Example 5 | 1.00 | 1.50 1.52 | 0.5–0.52 | 34 | 100 | 24 |

As one can easily understand from Table 6, as the |n1–n2| value becomes large, the luminescence brightness tends to become small. Particularly, in case the |n1–n2| value is larger than 0.4, the decrease in the luminescence brightness is remarkable. Therefore, the absolute value of the difference of refractive index n1 of the transparent medium and refractive index n2 of the color modulating layer is preferably smaller than 0.4.

COMPARATIVE EXAMPLES 6–8

The relation between the surface roughness |T1–T2| of color modulating member and the defect of the organic EL display device, and the relation between said roughness and occurrence of cross talk were surveyed. First, three glass substrates (Corning 7059, 100 mm×100 mm×1.1 mm thickness) for supporting substrates were prepared. The color modulating member in Example 1 were spin-coating at various rotational speed. Thus, color modulating member whose surface roughness |T1–T2| was 3.0 μm (Comparative Example 6), 4.0 μm (Comparative Example 7), and 5.0 μm (Comparative Example 8) were prepared.

Then, transparent media and organic EL elements were serially prepared on the color modulating member obtained, in a way similar to Example 1, to prepare the organic EL display device according to the present invention.

Next, frequency of non-luminescing part (defect frequency) and frequency of cross talk were visually observed by driving the organic EL display device in a way similar to Examples 7–10. The result is summarized in Table 7.

This result revealed that in case the surface roughness value |T1–T2| of color modulating member is larger than 2.0 μm, defect frequency and frequency of cross talk tend to increase (higher than 30% of overall display area).

TABLE 7

| | |T1–T2| | Frequency of Defect | Frequency of cross talk |
|---|---|---|---|
| Example 7 | 0.2 μm | Rare | Rare |
| Example 8 | 0.5 μm | Rare | Rare |
| Example 9 | 1.0 μm | Rare | Rare |
| Example 10 | 2.0 μm | Rare | Rare |
| Comparative Example 6 | 3.0 μm | Frequent | Frequent |
| Comparative Example 7 | 4.0 μm | Frequent | Frequent |
| Comparative Example 8 | 5.0 μm | Frequent | Frequent |

COMPARATIVE EXAMPLE 9

An organic EL display device was constructed as described in FIGS. 2b and 3a under the same condition as Example 11, except d1 value was 110 μm, d2 value was 50 μm, and a glass plate (borosilicate glass) having a thickness of 0.1 mm was attached as a transparent medium using a transparent adhesive. When the organic EL display device constructed was driven, blot and fuzziness of display were observed as shown in Table 5, and good display was not given.

INDUSTRIAL APPLICABILITY

The organic electroluminescence display device as described above, in which (1) color modulating member containing shading layers and color modulating layers and (2) organic EL electroluminescent members containing organic EL elements are placed sandwiching a transparent medium, wherein the relation d2≧d1 is satisfied, with d1 being a distance between a color modulating member and an organic EL electroluminescent member, and d2 being a width of a shading layer, which provides a excellent viewing angle property and prevents occurrence of color-shift (color mixing) and blot, is useful as a practical organic EL display device having an excellent visuality.

What is claimed is:

1. An organic electroluminescence display device comprising:
    a color modulating member comprising a shading layer and a color modulating layer;
    an organic electroluminescent member comprising an organic electroluminescence element; and
    a transparent medium inactive for the organic electroluminescent member, said transparent medium between said color modulating member and said organic electroluminescent member, and wherein said display device satisfies the relation d2≧d1, wherein d1 is a distance between said color modulating member and said organic electroluminescent member and d2 is the width of said shading layer.

2. The organic electroluminescence display device according to claim 1, wherein said color modulating member comprises different types of color modulating layers.

3. The organic electroluminescence display device according to claim 1, wherein said color modulating member comprises the same type of color modulating layers.

4. The organic electroluminescence display device according to claim 1, wherein the relation T1≧T2 is satisfied, with T1 being a thickness of said shading layer, and T2 being a thickness of said color modulating layer.

5. The organic electroluminescence display device according to claim 1, wherein the absolute value |T1–T2| is 2.0 μm or less, with T1 being a thickness of said shading layer, and T2 being a thickness of said color modulating layer.

6. The organic electroluminescence display device according to claim 1, wherein the relation S1≦S2 is satisfied, with S1 being the area of a luminescent region of said organic electroluminescence element, S2 being the area of said color modulating layer.

7. The organic electroluminescence display device according to claim 1, wherein said color modulating layer comprises a fluorescent layer.

8. The organic electroluminescence display device according to claim 1, wherein the thickness of said color modulating layer is 5 μm or more.

9. The organic electroluminescence display device according to claim 1, wherein the absolute value |n1–n2| is less than 0.4, with n1 being a refractive index of said color modulating layer, and n2 being a refractive index of said transparent medium.

10. The organic electroluminescence display device according to claim 1, wherein the transmittance of light in a visible region at 400–700 nm in wavelength of said shading layer is 10% or less.

11. The organic electroluminescence display device according to claim 1, further comprising a substrate, wherein the substrate, the organic electroluminescent member, the transparent medium and the color modulating member are sequentially positioned.

12. The organic electroluminescence display device according to claim 1, further comprising a switching means for applying voltage to allow luminescence of the organic electroluminescent member.

13. The organic electroluminescence display device according to claim 12, wherein the switching means is a thin film transistor.

14. The organic electroluminesence display device of claim 1, wherein the transparent medium is fluorinated hydrocarbon.

15. The organic electroluminesence device of claim 1, wherein the transparent medium is silicone oil.

16. An organic electroluminescence display device sequentially comprising:
   a substrate;
   a color modulating member comprising a shading layer and a color modulating layer;
   a transparent medium; and
   an organic electroluminescent member comprising an organic electroluminescence element, wherein said display device satisfies the relation $d2 \geq d1$ and wherein $d1$ is a distance between said color modulating member and said organic electroluminescent member and $d2$ is the width of said shading layer.

17. The organic electroluminescence display device according to claim 16, further comprising a switching means for applying voltage to allow luminescence of the organic electroluminescent member.

18. The organic electroluminescence display device according to claim 17, wherein the switching means is a thin film transistor.

19. An organic electroluminescence display devise comprising:
   a color modulating member comprising a shading layer and a color modulating layer;
   an organic electroluminescence member comprising an organic electroluminescence element; and
   a transparent medium between said color modulating member and said organic electroluminescent member, wherein said display device satisfies the relation $d2 \geq d1$ and wherein $d1$ is a distance between said color modulating member and said organic electroluminescent member and $d2$ is the width of said shading layer, and wherein the width of said shading layer becomes gradually or stepwise small from said transparent medium side toward an opposite side.

20. An organic electroluminescence display device comprising:
   a color modulating member comprising a shading layer and a color modulating layer;
   an organic electroluminescent member comprising an organic electroluminescence element; and
   a transparent medium between said color modulating member and said organic electroluminescent member, wherein said display device satisfies the relation $d2 \geq d1$ and wherein $d1$ is a distance between said color modulating member and said organic electroluminescent member and $d2$ is the width of said shading layer, and wherein the reflectivity of light in a visible region at 400–700 nm in wavelength of said shading layer is 10% or more.

21. An organic electroluminescence display device comprising:
   a color modulating member comprising a shading layer and a color modulating layer;
   an organic electroluminescent member comprising an organic electroluminescence element; and
   a transparent medium having a function of intercepting water and oxygen, said transparent medium between said color modulating member and said organic electroluminescent member, and wherein said display device satisfies the relation $d2 \geq d1$, wherein $d1$ is a distance between said color modulating member and said organic electroluminescent member and $d2$ is the width of said shading layer.

* * * * *